(12) United States Patent
Matthews et al.

(10) Patent No.: US 12,486,589 B2
(45) Date of Patent: Dec. 2, 2025

(54) ADDITIVE MANUFACTURING OF PARTS COMPRISING ELECTROPHORETIC AND ELECTROLYTIC DEPOSITS

(71) Applicant: Fabric8Labs, Inc., San Diego, CA (US)

(72) Inventors: Michael Matthews, San Diego, CA (US); David Pain, San Diego, CA (US); Sean Stone, San Diego, CA (US); Kareemullah Shaik, San Diego, CA (US); Charles Nicholas Pateros, Carlsbad, CA (US); Shiv Shailendar, San Diego, CA (US)

(73) Assignee: Fabric8Labs, Inc., San Diego, CA (US)

( * ) Notice: Subject to any disclaimer, the term of this patent is extended or adjusted under 35 U.S.C. 154(b) by 311 days.

(21) Appl. No.: 18/342,310

(22) Filed: Jun. 27, 2023

(65) Prior Publication Data

US 2024/0218545 A1 Jul. 4, 2024

Related U.S. Application Data

(60) Provisional application No. 63/436,504, filed on Dec. 31, 2022.

(51) Int. Cl.
*H05K 3/00* (2006.01)
*B33Y 10/00* (2015.01)
(Continued)

(52) U.S. Cl.
CPC ............. *C25D 1/003* (2013.01); *B33Y 10/00* (2014.12); *B33Y 30/00* (2014.12); *B33Y 80/00* (2014.12);
(Continued)

(58) Field of Classification Search
CPC ............................... H05K 1/11; H05K 3/4007
See application file for complete search history.

(56) References Cited

U.S. PATENT DOCUMENTS 4,575,330 A 3/1986 Hull
4,678,282 A 7/1987 Yaniv et al.
(Continued)

FOREIGN PATENT DOCUMENTS

CN 104178782 A 12/2014
CN 204097583 U 1/2015
(Continued)

OTHER PUBLICATIONS

Frey et al., "Switch-matrix-based High-Density Microelectrode Array in CMOS Technology", IEEE Journal of Solid- State-Circuits, Feb. 2010, pp. 467-482, vol. 45, No. 2.
(Continued)

*Primary Examiner* — Jeremy C Norris
(74) *Attorney, Agent, or Firm* — Polygon IP, LLP

(57) ABSTRACT

Described herein are methods and systems for additive manufacturing of parts comprising electrolytic deposits and electrophoretic deposits. Such methods and methods provide various new ways for integrating different materials into composite parts. Specifically, an additive manufacturing system comprises an electrode array with individually-addressable electrodes. Each individually-addressable electrode is coupled to a separate deposition control circuit, which selectively connects this electrode to a power supply. When forming a composite part, the electrode array can control the location of each electrolytic deposit (by controlling the current flow through each individually-addressable electrode) and each electrophoretic deposit (by controlling the electric field distribution). An electrolyte solution or an electrophoretic suspension is provided between the electrode array and deposition electrode to form corresponding
(Continued)

deposits. In addition to the electrode-array provided control, alternating the electrolytic and electrophoretic deposition operations can be used to locate the corresponding deposits within a composite part.

18 Claims, 11 Drawing Sheets

(51) Int. Cl.
*B33Y 30/00* (2015.01)
*B33Y 80/00* (2015.01)
*C25D 1/00* (2006.01)
*C25D 1/10* (2006.01)
*C25D 1/14* (2006.01)
*C25D 1/20* (2006.01)
*H05K 1/11* (2006.01)
*H05K 3/40* (2006.01)

(52) U.S. Cl.
CPC .............. *C25D 1/10* (2013.01); *C25D 1/14* (2013.01); *C25D 1/20* (2013.01); *H05K 1/11* (2013.01); *H05K 3/4007* (2013.01)

(56) References Cited

U.S. PATENT DOCUMENTS

| | | | |
|---|---|---|---|
| 5,132,820 A | 7/1992 | Someya et al. |
| 5,403,460 A | 4/1995 | Sala et al. |
| 5,641,391 A | 6/1997 | Hunter et al. |
| 5,998,805 A | 12/1999 | Shi et al. |
| 6,036,834 A | 3/2000 | Clerc |
| 7,839,831 B2 | 11/2010 | Vrcelj et al. |
| 8,168,540 B1 | 5/2012 | Reid et al. |
| 8,681,077 B2 | 3/2014 | Kimura |
| 9,777,385 B2 | 10/2017 | Wirth et al. |
| 10,465,307 B2 | 11/2019 | Pain et al. |
| 10,724,146 B1 | 7/2020 | Pain et al. |
| 10,914,000 B1 | 2/2021 | Pain et al. |
| 10,947,632 B1 | 3/2021 | Pain et al. |
| 11,232,956 B2 | 1/2022 | Pain et al. |
| 11,313,035 B2 | 4/2022 | Pain et al. |
| 11,313,036 B2 | 4/2022 | Pain et al. |
| 11,401,603 B2 | 8/2022 | Pain et al. |
| 2001/0014409 A1 | 8/2001 | Cohen |
| 2003/0006133 A1 | 1/2003 | Metzger |
| 2004/0129573 A1 | 7/2004 | Cohen |
| 2005/0045252 A1 | 3/2005 | Yamasaki et al. |
| 2005/0176238 A1 | 8/2005 | Cohen et al. |
| 2005/0183959 A1 | 8/2005 | Wilson et al. |
| 2005/0202660 A1 | 9/2005 | Cohen et al. |
| 2005/0223543 A1 | 10/2005 | Cohen et al. |
| 2006/0283539 A1 | 12/2006 | Slafer |
| 2007/0068819 A1 | 3/2007 | Singh et al. |
| 2007/0089993 A1 | 4/2007 | Schwartz et al. |
| 2007/0221504 A1 | 9/2007 | Luo |
| 2010/0300886 A1 | 12/2010 | Lin et al. |
| 2011/0210005 A1 | 9/2011 | Bossche et al. |
| 2017/0145584 A1 | 5/2017 | Wirth et al. |
| 2019/0160594 A1 | 5/2019 | Flamm et al. |
| 2021/0047744 A1 | 2/2021 | Biton |

FOREIGN PATENT DOCUMENTS

| | | |
|---|---|---|
| CN | 104593830 A | 5/2015 |
| WO | 2017087884 A1 | 5/2017 |
| WO | 2019150362 A1 | 8/2019 |
| WO | 2021041265 A1 | 3/2021 |

OTHER PUBLICATIONS

International Search Report and Written Opinion for PCT/US2020/047531 dated Sep. 29, 2020.
Nakamura et al., Incorporation of input function into displays using Ltps TFT technology, Journal of the SID, 2006, pp. 363-369, 14/4.
Stewart et al., "Polysilicon TFT Technology for Active Matrix OLEO Displays", IEEE Transactions on Electron Devices, May 2001, pp. 845-851, vol. 48, No. 5.
Supplementary International Search Report for PCT/US2020/047531 dated Nov. 22, 2021.
U.S. Appl. No. 17/535,437, filed Nov. 24, 2021.
U.S. Appl. No. 17/566,546, filed Dec. 30, 2021.

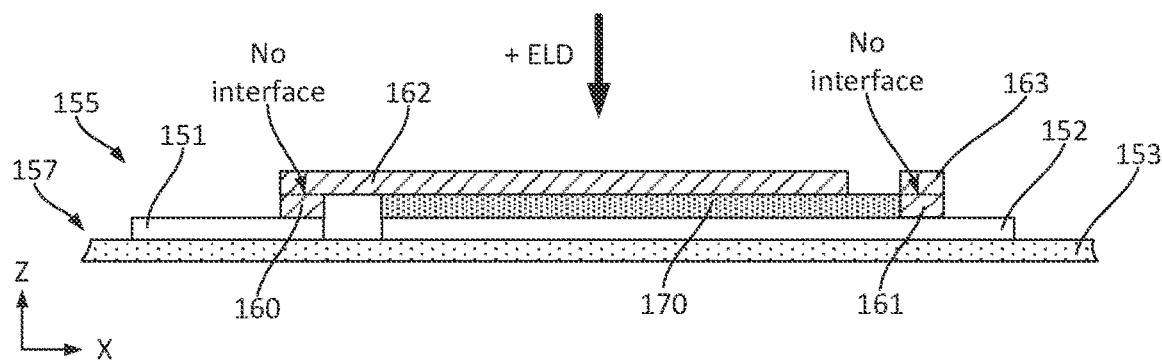
FIG. 4L
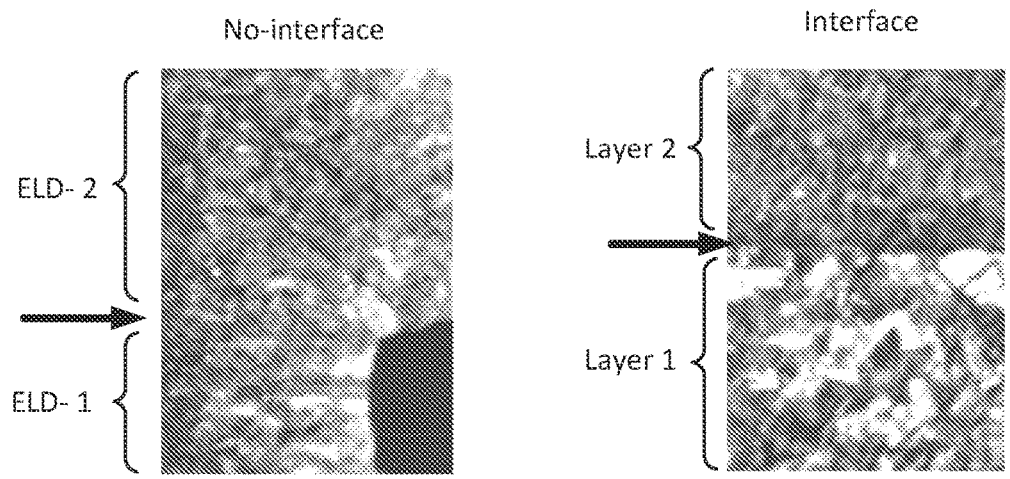
FIG. 4M
FIG. 4N
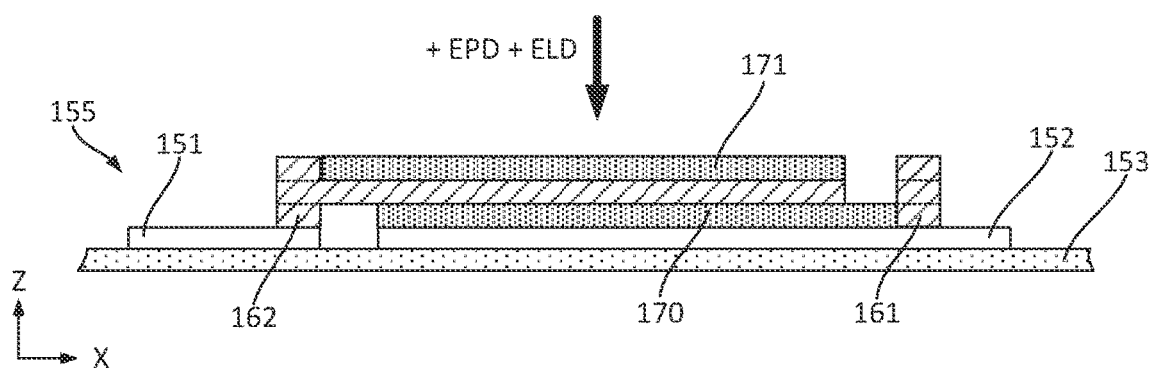
FIG. 4O

ADDITIVE MANUFACTURING OF PARTS COMPRISING ELECTROPHORETIC AND ELECTROLYTIC DEPOSITS

CROSS-REFERENCE TO RELATED APPLICATIONS

This application claims the benefit under 35 U.S.C. § 119(e) of U.S. Provisional Patent Application No. 63/436,504, filed on 2022 Dec. 31, which is incorporated herein by reference in its entirety for all purposes.

BACKGROUND

Additive manufacturing, also known as 3-dimensional (3D) printing, is often used to produce complex parts using a layer-by-layer deposition process on substrates. Additive manufacturing can utilize a variety of processes in which different materials (e.g., plastics, liquids, and/or powders) can be deposited, joined, and/or solidified. Some examples of techniques used for additive manufacturing include vat photopolymerization, material jetting, binder jetting, powder bed fusion (e.g., using selective laser melting or electron beam melting), material extrusion, directed energy deposition, and sheet lamination. However, metal additive manufacturing has been limited due to the high cost associated with selective laser melting and electron beam melting systems. Furthermore, thermal fusing produces parts with rough surface finishes because the unmelted metal powder is often sintered to the outer edges of the finished product. At the same time, electrochemical-additive manufacturing techniques may not be available for some materials (e.g., ceramics, polymers).

SUMMARY

Described herein are methods and systems for additive manufacturing of parts comprising electrolytic deposits and electrophoretic deposits. Such methods and methods provide various new ways for integrating different materials into composite parts. Specifically, an additive manufacturing system comprises an electrode array with individually-addressable electrodes. Each individually-addressable electrode is coupled to a separate deposition control circuit, which selectively connects this electrode to a power supply. When forming a composite part, the electrode array can control the location of each electrolytic deposit (by controlling the current flow through each individually-addressable electrode) and each electrophoretic deposit (by controlling the electric field distribution). An electrolyte solution or an electrophoretic suspension is provided between the electrode array and deposition electrode to form corresponding deposits. In addition to the electrode-array provided control, alternating the electrolytic and electrophoretic deposition operations can be used to locate the corresponding deposits within a composite part.

In some examples, provided is a method for additive manufacturing of a part comprising an electrolytic deposit and an electrophoretic deposit. The method comprises providing an additive manufacturing system comprising deposition control circuits, an electrode array comprising individually-addressable electrodes each electrically coupled to one of the deposition control circuits, and a deposition electrode. The method also comprises providing an electrolyte solution between the electrode array and the deposition electrode. The electrolyte solution comprises cation. The method comprises applying a first voltage between a first set of the individually-addressable electrodes and the deposition electrode thereby driving the cations to the deposition electrode and reducing the cations into the electrolytic deposit of the part on the deposition electrode. The method comprises replacing the electrolyte solution with an electrophoretic suspension between the electrode array and the deposition electrode. The electrophoretic suspension comprises solid charged structures. The method also comprises applying a second voltage between a second set of the individually-addressable electrodes and the deposition electrode thereby driving the solid charged structures to the deposition electrode and depositing the solid charged structures as the electrophoretic deposit of the part on the deposition electrode.

In some examples, the electrolytic deposit and the electrophoretic deposit are located at different portions of the deposition electrode and do not overlap. The first set of individually-addressable electrodes does not include any electrodes from the second set of individually-addressable electrodes. For example, the electrolytic deposit is formed before forming the electrophoretic deposit. In this example, applying the first voltage is performed before applying the second voltage. Alternatively, the electrolytic deposit is formed after forming the electrophoretic deposit, and applying the first voltage is performed after applying the second voltage.

In some examples, the electrolytic deposit and the electrophoretic deposit at least partially overlap. The first set of individually-addressable electrodes includes at least some electrodes from the second set of individually-addressable electrodes. For example, at least a portion of the electrolytic deposit is positioned between the electrophoretic deposit and the deposition electrode. In this example, applying the first voltage is performed before applying the second voltage. In some examples, at least a portion of the electrophoretic deposit extends past the electrolytic deposit such that the electrolytic deposit does not extend between this portion of the electrophoretic deposit and the deposition electrode.

In some examples, at least a portion of the electrophoretic deposit is positioned between the electrolytic deposit and the deposition electrode, and applying the first voltage is performed after applying the second voltage. In more specific examples, the method further comprises, after applying the second voltage and before applying the first voltage, forming a conductive seed layer over at least the portion of the electrophoretic deposit, wherein the electrolytic deposit covers at least a portion of the conductive seed layer. For example, the conductive seed layer is formed using side-way electrolytic deposition using a seed-layer electrolyte solution between the electrode array and the deposition electrode. Alternatively, the conductive seed layer is formed using sputtering. In some examples, at least an additional portion of the conductive seed layer remains uncovered by the electrolytic deposit. In some examples, the conductive seed layer is a part of the electrolytic deposit.

In some examples, the method further comprises, after applying the second voltage: (a) forming a conductive seed layer over at least a portion of the electrophoretic deposit and (b) depositing additional solid charged structures as an electrophoretic deposit on the part on the seed layer. In the same or other examples, the method further comprises depositing an additional electrolytic deposit over an electrophoretic deposit of the part on the deposition electrode.

In some examples, the first set of individually-addressable electrodes includes at least some electrodes from the second set of individually-addressable electrodes. In these examples, depositing the solid charged structures as the electrophoretic deposit is performed before reducing the cations into the electrolytic deposit. The electrolytic deposit and the electrophoretic deposit do not overlap.

In some examples, the electrolytic deposit comprises at least one of copper, nickel, tungsten, gold, silver, cobalt, chrome, iron, or tin. The electrophoretic deposit comprises at least one of ceramic, polymer, or glass. In some examples, the method further comprises (a) after applying the first voltage, flushing the electrolyte solution between the electrode array and the deposition electrode, and (b) after applying the second voltage, flushing the electrophoretic suspension between the electrode array and the deposition electrode.

Also provided is an additive manufacturing system for additive manufacturing a part comprising an electrolytic deposit and an electrophoretic deposit. In some examples, the additive manufacturing system comprises deposition control circuits, an electrode array comprising individually-addressable electrodes each electrically coupled to one of the deposition control circuits, a deposition electrode, an electrolyte solution source configured to provide an electrolyte solution between the electrode array and the deposition electrode, wherein the electrolyte solution comprises cations, an electrophoretic suspension source configured to provide an electrophoretic suspension between the electrode array and the deposition electrode, wherein the electrophoretic suspension comprises solid charged structures, and a deposition power supply electrically coupled to the deposition control circuits and the deposition electrode. The deposition power supply is configured to apply a first voltage between a first set of the individually-addressable electrodes and the deposition electrode thereby driving the cations to the deposition electrode and reducing the cations into the electrolytic deposit of the part on the deposition electrode. The deposition power supply is also configured to apply a second voltage between a second set of the individually-addressable electrodes and the deposition electrode thereby driving the solid charged structures to the deposition electrode and depositing the solid charged structures as the electrophoretic deposit of the part on the deposition electrode.

Also provided is a part formed using additive manufacturing and comprising a substrate operable as a deposition electrode during the additive manufacturing. The substrate may be a printed circuit board comprising a dielectric base, a first conductive portion, and a second conductive portion. The part also comprises an electrolytic deposit, formed on the first conductive portion, an electrophoretic deposit, formed on the second conductive portion, and a second-layer electrolytic deposit, formed over the electrolytic deposit and at least a portion of the electrophoretic deposit, wherein the electrolytic deposit and the second-layer electrolytic deposit are monolithic with each other without a defined grain boundary between the electrolytic deposit and the second-layer electrolytic deposit.

BRIEF DESCRIPTION OF THE DRAWINGS

FIGS. 4H-4Q illustrates additional examples of a part, which is formed using additive manufacturing and comprising electrolytic and electrophoretic deposits.

DETAILED DESCRIPTION

Figure 1A:
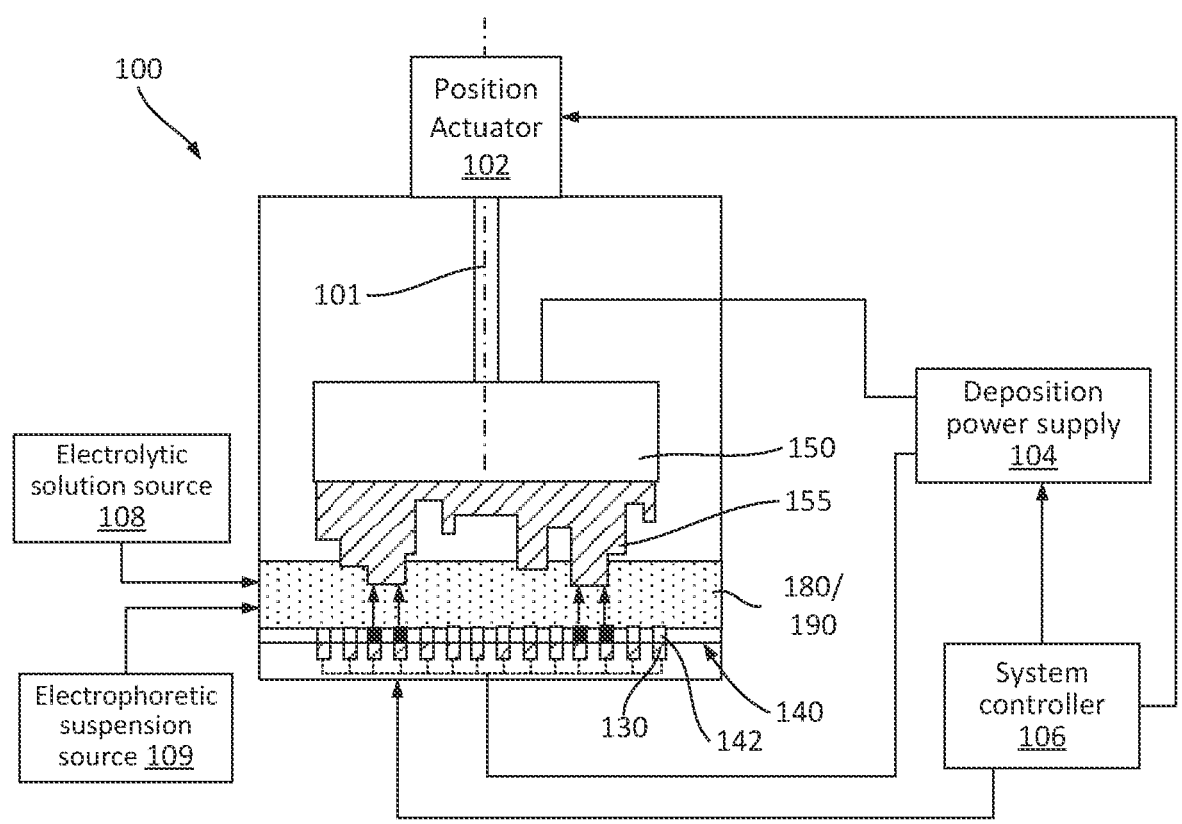
FIG. 1A is a schematic illustration of an additive manufacturing system used for the electrolytic and electrophoretic deposition of different materials on a deposition electrode using individually-addressable electrodes, in accordance with some examples.
Figure 1A:
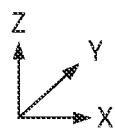

In the following description, numerous specific details are outlined to provide a thorough understanding of the presented concepts. The presented concepts may be practiced without some or all of these specific details. In other instances, well-known process operations have not been described in detail to not unnecessarily obscure the described concepts. While some concepts will be described in conjunction with the specific embodiments, it will be understood that these embodiments are not intended to be limiting.

INTRODUCTION

Described herein are additive manufacturing systems that can be used for both electrolytic and electrophoretic depositions. Specifically, an additive manufacturing system comprises two electrodes, one of which is arranged into an electrode array to provide granular control over deposition conditions (e.g., the current density distribution during electrolytic deposition and, separately, the electric field distribution during the electrophoretic deposition). The electrode array is formed by individually-addressable electrodes, which can be arranged as a grid and can be also referred to as electrode pixels or pixelated electrodes.

During electrolytic deposition, these individually-addressable electrodes can be selectively used as anodes/ positive electrodes and receive electrons from the electrolyte. As such, these individually-addressable electrodes can be referred to as pixelated anodes, anode pixels, or pixels. Selective use means that a current is allowed to use through this set of individually-addressable electrodes (e.g., by connecting this set to a power supply using their corresponding deposition control circuits). Other individually-addressable electrodes may remain unused (e.g., remain disconnected from the power supply). The selected electrodes can be also referred to as activated electrodes or activated pixels. The remaining (unselected) electrodes may be referred to as inactive electrodes or inactive pixels. Portions of the deposition electrode, positioned proximate to these activated pixels, receive cations from the electrolyte. These cations are reduced and form electrolytic deposits on these portions of the deposition electrode. On the other hand, other portions of the deposition electrode, positioned proximate to the inactivated pixels, do not receive any electrolytic deposits due to the current density distribution through the electrolyte controlled by the selective activation of the pixels.

During electrophoretic deposition, solid charged materials (e.g., solid structures such as particles, core-shell structures, polymers, and monomers) provided in an electrophoretic suspension, are driven by the electric field between the activated pixels of the electrode arrays and the deposition electrode. Charged solid materials should be distinguished from ions (e.g., cations) used in electrolytic deposition. For simplicity, all types of solid charged materials are referred to as solid charged structures and can include any type of particles. Specifically, these solid charged structures are driven to the portions of the deposition electrode, positioned proximate to these activated pixels, and electrophoretic deposits are formed on these portions. On the other hand, other portions of the deposition electrode, positioned proximate to the inactivated pixels, do not receive any electrophoretic deposits due to the electric field distribution between the electrode array and the deposition electrode, again controlled by the selective activation of the pixels. Overall, the selective activations of anode pixels in the electrode arrays can be used to determine the locations of electrolytic and electrophoretic deposits.

The electrode array may be also referred to as a printhead, providing a reference to 3D printing aspects of additive manufacturing systems. An instantaneous activation pattern produced by the array (by controllably activating a subset of individually-addressable electrodes/pixels) may be referred to as an "image" (e.g., electrolytic image, electrophoretic image). The operation of individually-addressable electrodes can be controlled using deposition control circuits, e.g., thin-film transistors, in which case, the array can be referred to as a thin-film transistor (TFT) array or a TFT micro-electrode array. These individually-addressable electrodes and corresponding deposition control circuits can be arranged in various patterns/grids, e.g., 2-D rectangular, 2-D hexagonal, and other like patterns. Furthermore, these individually-addressable electrodes may be of uniform or non-uniform size, shape, thickness, composition, and other characteristics.

Referring to electrolytic deposition, the current density distribution is a critical parameter during this process. The current density distribution is influenced by the electrolyte conductivity, electrode shapes/positions relative to each other, electrode surface properties (e.g., the presence and properties of surface-active molecules), and selective activation of individually-addressable electrodes (which is one distinguishing feature and advantage of additive manufacturing systems over conventional electrolytic deposition systems). When a deposition electrode is positioned sufficiently close to an electrode array, this current density distribution at each individually-addressable electrode is translated into the corresponding portions of the deposition electrode (e.g., the portions aligned with the activated individually-addressable electrodes). This corresponding current density distribution can be used for controlling plating rates, grain structures, grain sizes, and deposits' compositions among other characteristics. Overall, this current density control can be used to fabricate 3D parts ("prints") by successive controlled deposition of layers based on the desired properties of the product.

Referring to electrophoretic deposition, the electrical field distribution is a critical parameter during this process. The electrical field distribution is influenced by the electrophoretic suspension conductivity, electrode shapes/positions relative to each other, electrode surface properties, and selective activation of individually-addressable electrodes (which is one distinguishing feature and advantage of additive manufacturing systems over conventional electrolytic deposition systems). As such, the same control features of an additive manufacturing system (i.e., selective activation of individually-addressable electrodes), which are used for controlling the electrolytic deposition, can be also used for controlling the electrophoretic deposition. It should be noted that the deposition principles are quite different as further described below.

Specifically, electrolytic deposition (ELD) relies on the current flow and the reduction of cations provide in an electrolyte solution. Electrophoretic deposition (EPD) uses an electric field to cause charged particles to be deposited from a liquid colloidal suspension/electrophoretic suspension onto an oppositely charged conductive surface. Various types of charged particles are within the scope, such as polymers or, more specifically, polyvinyl alcohol, polyethylene glycol, polyethyleneimine, polyacrylamide, polyvinylpyrrolidone, siloxanes, olefins, and fluoropolymers. These charged particles can be used to create electrophoretic deposits on the deposition electrodes in an additive manufacturing system, which is also used for electrolytic deposition. In fact, an additive manufacturing system can be used to form one or more electrophoretic deposits and one or more electrolytic deposits of the same part, which may be referred to as a composite part.

Additive Manufacturing System Examples

FIG. 1A is a schematic illustration of additive manufacturing system 100 used for manufacturing (e.g., depositing, forming) part 155 comprising electrolytic deposit 160 and electrophoretic deposit 170. Various arrangements of electrolytic deposit 160 and electrophoretic deposit 170 in part 155 are described below with reference to FIGS. 4A-4I. Furthermore, various operations performed by additive manufacturing system 100 are described below with reference to FIG. 5.

In some examples, additive manufacturing system 100 comprises position actuator 102, system controller 106, deposition power supply 104, electrode array 140, deposition electrode 150, electrolyte solution source 108, and electrophoretic suspension source 109. Electrode array 140 comprises deposition control circuits 130 and individually-addressable electrodes 142 such that each deposition control circuit 130 controls the voltage applied to (and in some examples, the current flow through) a corresponding one of individually-addressable electrodes 142 (e.g., based on input from system controller 106). In more specific examples, each deposition control circuit 130 controls the connection between a corresponding one of individually-addressable electrodes 142 and deposition power supply 104 (which is also connected to deposition electrode 150).

Position actuator 102 can be mechanically coupled to electrode array 140 and/or deposition electrode 150 and used to change the relative position of electrode array 140 and deposition electrode 150 (e.g., changing the gap between electrode array 140 and deposition electrode 150, linearly moving and/or rotating one or both electrode array 140 and deposition electrode 150 within a plane parallel to the electrode array 140). While FIG. 1A illustrates position actuator 102 being coupled to deposition electrode 150, other examples are also within the scope. For example, position actuator 102 can increase the gap between electrode array 140 and deposition electrode 150 when introducing fresh electrolyte solution 180 and/or electrophoretic suspension 190. Furthermore, position actuator 102 can increase the gap between electrode array 140 and deposition electrode 150 as the thickness of part 155 increases, e.g., to maintain the desired gap between part 155 and electrode array 140. In some examples, electrolytic and electrophoretic deposition operations may utilize different gaps between electrode array 140 and deposition electrode 150.

System controller 106 is used for controlling the operations of various components. For example, FIG. 1A illustrates system controller 106 being communicatively coupled with position actuator 102, deposition power supply 104, and deposition control circuits 130. For example, system controller 106 can instruct position actuator 102 to change the relative position of electrode array 140 and deposition electrode 150. In the same or other examples, system controller 106 can selectively instruct some deposition control circuits 130 to provide current through corresponding individually-addressable electrodes 142. In some examples, system controller 106 can include a set of instructions corresponding to various operations of a method for additive manufacturing of part 155, further described below with reference to FIG. 5.

In some examples, deposition power supply 104 is configured to apply a first voltage between a selected set of individually-addressable electrodes 142 and deposition electrode 150, e.g., during electrolytic deposition. This voltage drives cations to deposition electrode 150 and causes these cations to reduce into an electrolytic deposit of part 155 on deposition electrode 150 as further described below. Deposition power supply 104 is also configured to apply a second voltage between a selected set of individually-addressable electrodes 142 and deposition electrode 150. This voltage drives solid charged structures to deposition electrode 150 and causes these solid charged structures to form an electrophoretic deposit of part 155 on deposition electrode 150. In other words, deposition power supply 104 can be configured to operate over a large range of voltages (e.g., between 0.1V and 50V or, more specifically, between 0.2V and 30V). It should be noted that the first voltage (i.e., the electrolytic deposition voltage) can be different (e.g., smaller) than the second voltage (i.e., the electrophoretic deposition voltage).

Electrolyte solution source 108 is configured to provide electrolyte solution 180 between electrode array 140 and deposition electrode 150. For example, electrolyte solution source 108 can be equipped with a tank containing a fresh batch of electrolyte solution 180 and a pump. Electrolyte solution source 108 can be controlled using system controller 106. In some examples, electrolyte solution source 108 can be equipped with a heater to control the temperature of electrolyte solution 180 upon delivering this electrolyte solution 180 between electrode array 140 and deposition electrode 150. Electrolyte solution 180 comprises cations, used to form the electrolytic deposit of part 155. Additional aspects of electrolyte solution 180 are described below with reference to FIG. 2B. In some examples, electrolyte solution 180 is provided in an electrolyte-carrying structure, e.g., sponge, porous film, mesh, and the like. The electrolyte-carrying structure can be advanced (e.g., can be rewound) between electrode array 140 and deposition electrode 150 as electrolyte solution 180 is consumed. In some examples, electrode array 140 and deposition electrode 150 are advanced toward each other to displace (squeeze) electrolyte solution 180 from the electrolyte-carrying structure.

Electrophoretic suspension source 109 is configured to provide electrophoretic suspension 190 between electrode array 140 and deposition electrode 150. For example, electrophoretic suspension source 109 can be equipped with a tank containing a fresh batch of electrophoretic suspension 190 and a pump. Electrophoretic suspension source 109 can be controlled using system controller 106. In some examples, electrophoretic suspension source 109 can be equipped with a heater to control the temperature of electrophoretic suspension 190 upon delivering this electrophoretic suspension 190 between electrode array 140 and deposition electrode 150. Electrophoretic suspension 190 comprises solid charged structures used to form the electrophoretic deposit of part 155. Additional aspects of electrophoretic suspension 190 are described below with reference to FIG. 3C. In some examples, electrophoretic suspension 190 is provided in a suspension-carrying structure, e.g., sponge, porous film, mesh, and the like. The suspension-carrying structure can be advanced (e.g., can be rewound) between electrode array 140 and deposition electrode 150 as electrophoretic suspension 190 is consumed. In some examples, electrode array 140 and deposition electrode 150 are advanced toward each other to displace (squeeze) electrophoretic suspension 190 from the suspension-carrying structure.

Figure 1B:
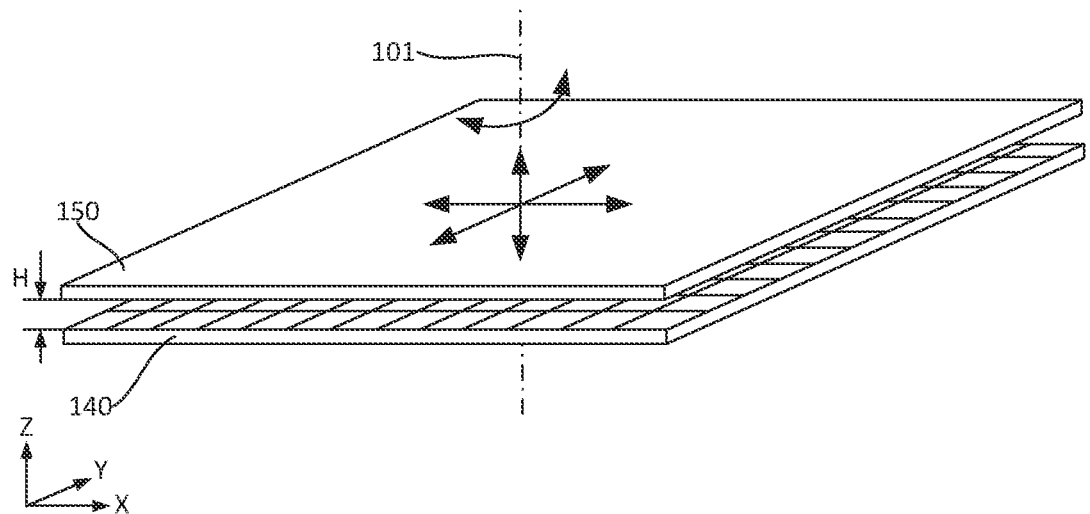
FIGS. 1B and 1C are schematic illustrations of an electrode array comprising individually-addressable electrodes (pixel electrodes), in accordance with some examples.

FIG. 1B is a perspective schematic view of electrode array 140 and deposition electrode 150, in accordance with some examples. This combination of electrode array 140 and deposition electrode 150 may be also referred to as an electrodeposition cell, which is a primary component of additive manufacturing system 100. Deposition electrode 150 and electrode array 140 form a gap, which is filled (partially or fully) with an electrolyte solution or electrophoretic suspension during the operation. The height (H) of this gap is specifically controlled (e.g., between 5 micrometers and 200 micrometers) as the height influences the deposition conditions. For example, an excessive gap height can result in lower deposition rates and less control over the deposition locations. On the other hand, a gap height below the target value can cause excessive deposition rates and even shorts. It should be noted that the height gap can be different at different portions of deposition electrode 150 and electrode array 140. Furthermore, the average gap height can change between various deposition and electrolyte flow stages (e.g., using position actuator 102). For example, the average gap height can be increased to decrease the average current flow between deposition electrode 150 and electrode array 140 (and vice versa). Furthermore, the gap can be increased (while the deposition is suspended) to flow fresh electrolyte solution or electrophoretic suspension into the gap. Overall, deposition electrode 150 and electrode array 140 can be moved relative to each in various directions as indicated in FIG. 1B, e.g., along primary axis 101 and/or within the plane perpendicular to primary axis 101 (including the rotation about primary axis 101).

Figure 1C:
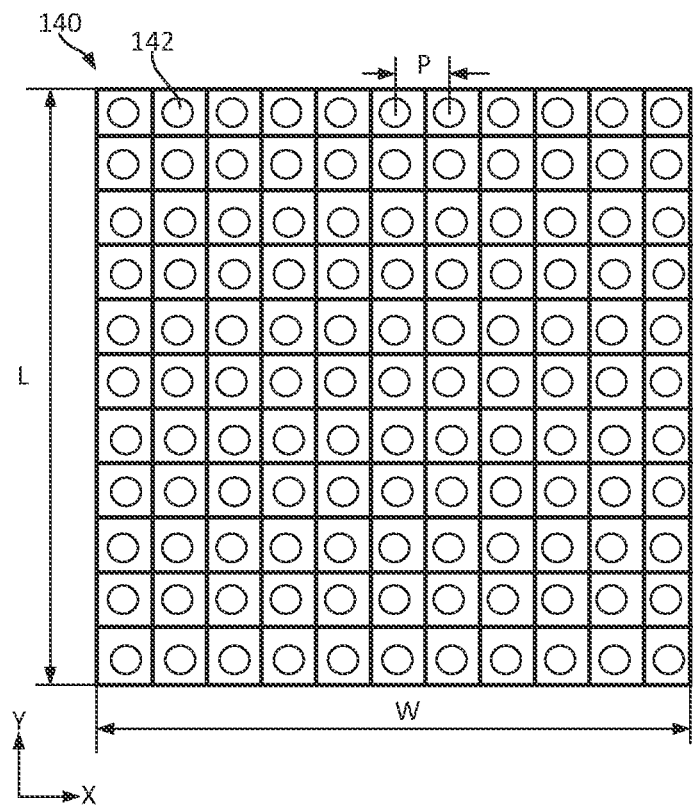

Referring to FIG. 1C, electrode array 140 comprises individually-addressable electrodes 142, which may be also referred to as grid regions, microelectrodes (or micro-anodes), and/or pixels. Each deposition control circuit 130 is connected to one of individually-addressable electrodes 142 and controls the application of voltage to and flow of the electric current through this individually-addressable electrode 142 independently through other individually-addressable electrodes 142. This individually-addressable feature allows the achievement of different deposition rates at different locations on deposition electrode 150. Individually-addressable electrodes 142 form a deposition grid, in which these portions may be offset relative to each other along the X-axis and Y-axis. The grid may be characterized by a grid X-axis resolution (corresponding to the number of grid regions along the X-axis), grid Y-axis resolution (corresponding to the number of grid regions along the Y-axis), grid X-axis pitch (corresponding to the length of each grid region along the X-axis), grid Y-axis pitch (corresponding to the length of a grid region along the Y-axis), overall grid pitch (corresponding to the minimum of the grid X-axis pitch and the grid Y-axis pitch), and grid region area. In some examples, one or both of the grid's X-axis resolution and the Y-axis resolution is between 50 and 500, such as between 75 and 250. In the same or other examples, one or both of the grid's X-axis pitch and the Y-axis pitch are 100 micrometers or less, 50 micrometers or less, or even 35 micrometers or less. Other example grids include triangular, hexagonal, or other patterns that partially or tessellate a surface. In some examples, individually-addressable electrodes 142 are formed from an insoluble conductive material, such as platinum group metals and their associated oxides, doped semiconducting materials, and carbon nanotubes. The shape of individually-addressable electrodes 142 can be round, rectangular, or other shapes. The size of Individually-addressable electrodes 142 (the pixel size) is slightly smaller (e.g., at least 10% smaller, at least 20% smaller) than the pitch thereby providing the space between Individually-addressable electrodes 142. In one example, the pitch is between 25 micrometers and 35 micrometers, while the pixel size can be between 15 micrometers and 20 micrometers.

Electrolytic Deposition Examples

Figure 2A:
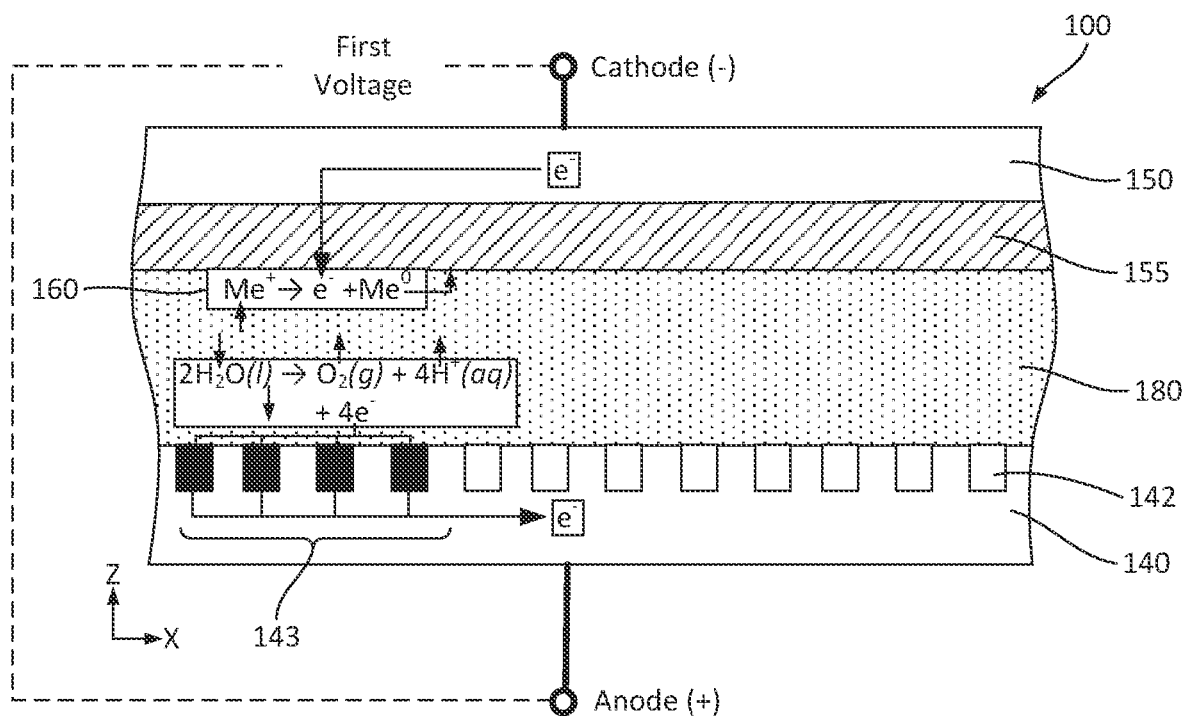
FIG. 2A is a schematic cross-sectional view of an additive manufacturing system during the electrolytic deposition, in accordance with some examples.
Figure 2B:
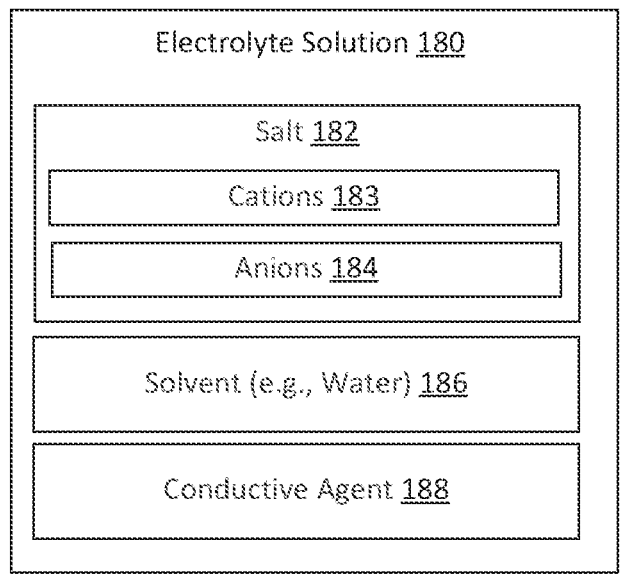
FIG. 2B is a block diagram illustrating various components of an electrolyte solution used for electrolytic deposition, in accordance with some examples.

FIG. 2A is a schematic expanded view of a portion of additive manufacturing system 100 during electrolytic deposition. During this operating stage, electrolyte solution 180 is provided between electrode array 140 and deposition electrode 150. FIG. 2B is a schematic block diagram illustrating different components of electrolyte solution 180. For example, electrolyte solution 180 may comprise salt 182, electrolyte solution solvent 186, and conductive agent 188. Salt comprises cations 183 and anions 184. Cations 183 can be in the form of metal ions, metal complexes, and the like. Some examples of cations 183 include metal cations (e.g., copper ions, nickel ions, tungsten ions, gold ions, silver ions, cobalt ions, chrome ions, iron ions, or tin ions), and other types of cations are within the scope. Some specific examples of salt 182 (feedstock ion sources) include but are not limited to copper sulfate, copper chloride, copper fluoroborate, copper pyrophosphate, nickel sulfate, nickel ammonium sulfate, nickel chloride, nickel fluoroborate, zinc sulfate, sodium thiocyanate, zinc chloride, ammonium chloride, sodium tungstate, cobalt chloride, cobalt sulfate, hydroxy acids, and aqua ammonia. In some examples, feedstock ion sources, or other sources of cations (e.g., salts) are referred to as material concentrates. Electrolyte solution solvent 186 can be water, which dissociates ($2H_2O(l) \Rightarrow O_2$(g)+4H+(aq.)+4e−) on electrode array 140 or, more specifically, on individually-addressable electrodes 142 that are activated during this operation. Specifically, the activated individually-addressable electrodes 142 are connected to deposition power supply 104 (by the corresponding deposition control circuits 130). In some examples, electrolyte solution 180 comprises catholyte conductive agent 188, such as an acid (e.g., sulfuric acid, acetic acid, hydrochloric acid, nitric acid, hydrofluoric acid, boric acid, citric acid, and phosphoric acid). In some examples, electrolyte solution 180 comprises one or more additives, such as a leveler, a suppressor, and an accelerator, particulates for co-deposition (e.g., nanoparticles and microparticles such that diamond particles, tungsten-carbide particles, chromium-carbide particles, and silicon-carbide particles).

Returning to the example shown in FIG. 2A, cations (e.g., metal cations are combined with electrons, which are supplied to deposition electrode 150 thereby forming part 155 (e.g., metal deposit—$Me^0$). As noted above, the charge balance within electrolyte solution 180 is maintained by protons generated at electrode array 140. It should be noted that only a set of individually-addressable electrodes 142 (e.g., first set 143 of the individually-addressable electrodes 142 in FIG. 2A) can be activated during this electrolytic deposition process resulting in electrolytic deposit 160 formed on a corresponding portion of deposition electrode 150 (i.e., the portion aligned with first set 143 of the individually-addressable electrodes 142). The remaining portion of deposition electrode 150 remains free of electrolytic deposit 160. This selective deposition is a core electrolytic deposition feature provided by selective control of the current passing through individually-addressable electrodes 142. In some examples, electrolytic deposit 160 comprises at least one of copper, nickel, tungsten, gold, silver, cobalt, chrome, iron, or tin. However, other examples are within the scope.

Electrophoretic Deposition Examples

Figure 3A:
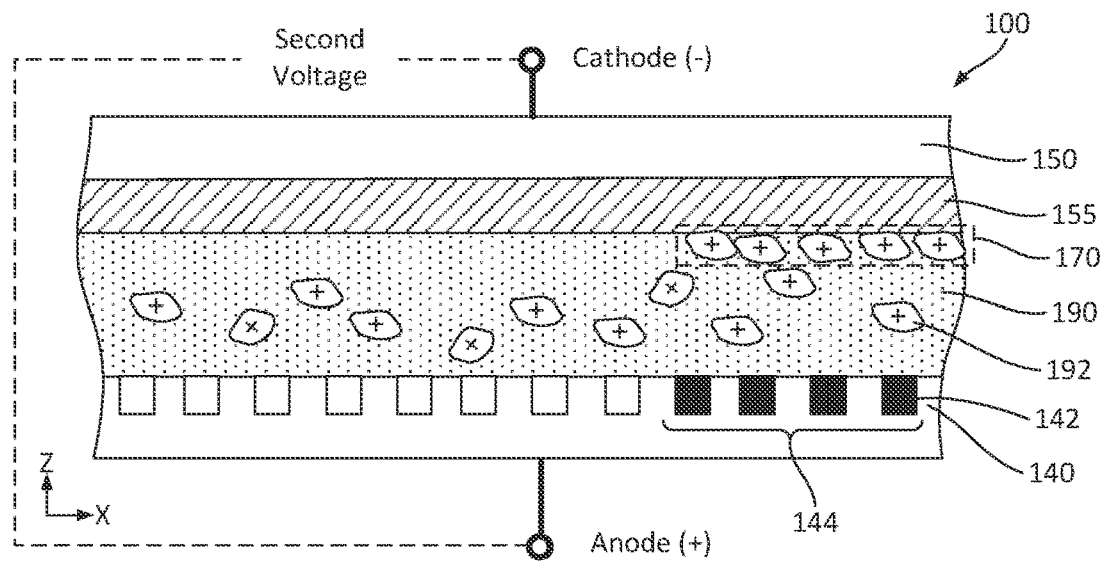
FIG. 3A is a schematic cross-sectional view of an additive manufacturing system during the electrophoretic deposition or, more specifically, cathodic electrophoretic deposition, in accordance with some examples.
Figure 3B:
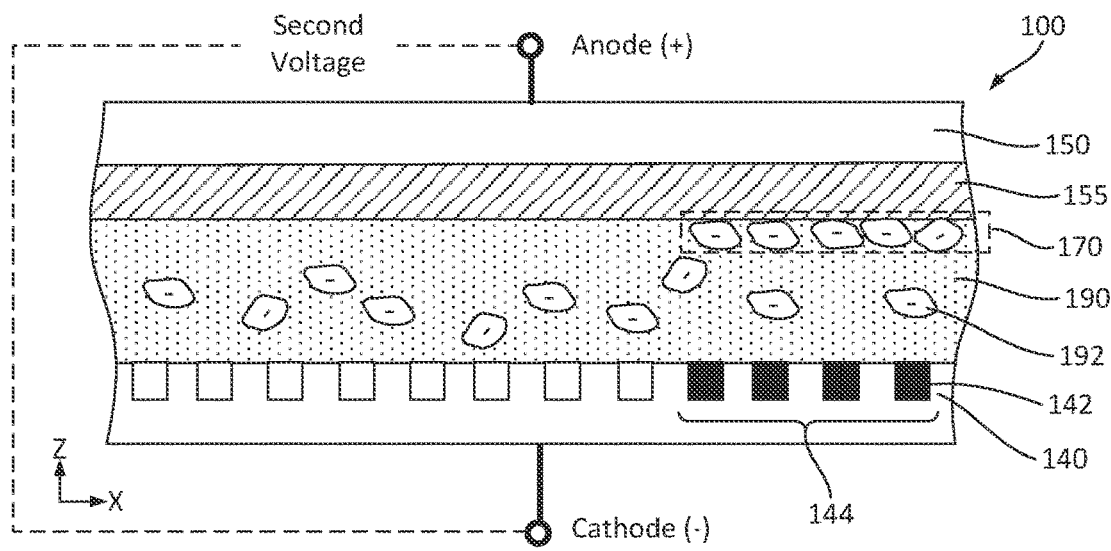
FIG. 3B is a schematic cross-sectional view of an additive manufacturing system during the electrophoretic deposition or, more specifically, anodic electrophoretic deposition, in accordance with some examples.

FIG. 3A is a schematic cross-sectional view of additive manufacturing system 100 during electrophoretic deposition or, more specifically, during cathodic electrophoretic deposition, which utilizes solid charged particles 192 with a positive charge in electrophoretic suspension 190. FIG. 3B is a schematic cross-sectional view of additive manufacturing system 100 during anodic electrophoretic deposition, which utilizes solid charged particles 192 with a negative charge in electrophoretic suspension 190. In either case, when a voltage/electric field is applied between electrode array 140 and deposition electrode 150 causing solid charged structures 192 to migrate towards deposition electrode 150 (that has a charge opposite to that of solid charged structures 192) and form electrophoretic deposit 170 on deposition electrode 150. Electrophoretic deposition can involve one of the following mechanisms (1) charge destruction causing the solubility decrease, (2) concentration coagulation, and (3) salting out. For example, during an anodic deposition, a fully protonated acid carries no charge (by the way of charge destruction) and, as a result, is less soluble in electrophoretic suspension solvent 196 (e.g., water) causing its precipitation on deposition electrode 150. In another example, during a cathodic deposition, a protonated base of a polymer (used as solid charged structures 192) can react with hydroxyl ions (e.g., formed by electrolysis of water used as electrophoretic suspension solvent 196) forming a neutral charged base such that the uncharged polymer is less soluble causing the precipitation. In yet another example, onium salts can be used in solid charged structures 192 that are cathodically deposited by concentration coagulation and salting out. Specifically, colloidal particles are charge-squeezed on the deposition surface forming larger micelles that are less stable causing their precipitate.

Figure 3C:
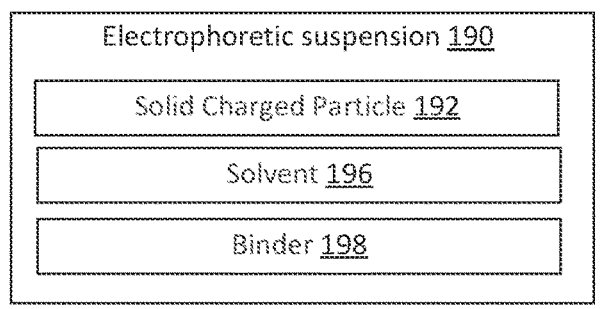
FIG. 3C is a schematic block diagram illustrating various components of electrophoretic suspension, in accordance with some examples.

FIG. 3C is a block diagram illustrating various components of electrophoretic suspension 190, in accordance with some examples. In addition to solid charged structures 192, electrophoretic suspension 190 may comprise electrophoretic suspension solvent 196 and binder 198, e.g., comprising ceramics and/or metals in some examples. Some examples of solid charged structures 192 include but are not limited to polymers or, more specifically, polyelectrolytes (i.e., polymers with ionizable groups). In electrophoretic suspension 190, the interaction between the ionizable groups can lead to the formation of complexes, which can influence viscosity, surface tension, and stability as well as EPD properties. The choice of acid and base used to form ionizable groups determines the charge. For example, if an acid (e.g., hydrochloric acid) is reacted with a polymer containing amine groups, the product is solid charged particles 192 with a positive charge. Conversely, if a base (e.g., sodium hydroxide) is reacted with a polymer containing carboxylic acid groups, the resulting particles will carry a negative charge. Some examples of suitable polymers include but are not limited to polyvinyl alcohol, polyethylene glycol, polyethyleneimine, polyacrylamide, polyvinylpyrrolidone, siloxanes, olefins, and fluoropolymers) and polyurethane.

Some examples of electrophoretic suspension solvent 196 include but are not limited to methanol, ethanol, n-propanol, iso-propanol, n-butanol, ethylene glycol, acetylacetone, cyclohexane, dichloromethane, methyl ethyl ketone (MEK), toluene, and acetone. In some examples, water can be used as electrophoretic suspension solvent 196 in electrophoretic suspension 190. However, water may limit using high direct current (DC) voltages (e.g., above 4V) during EPD due to the water electrolysis, although some success may be possible at higher voltages using AC and/or pulsed DC. At the same time, low voltages may limit the thickness of electrophoretic deposit 170 and reduce the electrophoretic deposition rate. Non-aqueous solvents can allow the application of higher voltages. Furthermore, electrophoretic suspension solvent 196 may have a specific dielectric constant (e.g., between 10 and 30) to provide sufficient dissociative power while providing sufficient electrophoretic mobility (especially with high concentrations of solid charged structures 192).

Some examples of binder 198 include but are not limited to polydiallyldimethylammonium chloride (PDDA) and polyurethane (e.g., a binder in LEGOR KLIAR-BLU). In some examples, binder 198 is removed from the final composition of electrophoretic deposit 170, e.g., through a process such as burnout.

These materials are mixed into electrophoretic suspension 190, which has different composition and properties than electrolyte solution 180 described above. Specifically, electrolyte solution 180 is used for electrolytic deposition that involves cations (provided in electrolyte solution 180) reduction on deposition electrode 150. Electrolyte solution 180 needs to be highly conductive and typically uses water as a solvent. Electrophoretic suspension 190 is used for EPD that involves transferring/driving solid charged structures 192 (suspended in electrophoretic suspension solvent 196) to portions of electrode array 140. Unlike electrolytic deposition, electrophoretic deposition is not a current-driven process (negligible currents can result from charge carried by solid charged structures 192). Electrophoretic suspension 190 needs to have low conductivity and typically uses organic materials as a solvent although water is still within the scope.

In some examples, the conductivity of electrophoretic suspension 190 is significantly lower than that of electrolyte solution 180, e.g., at least 10 times lower, at least 100 times lower, or even 1000 times lower. However, when electrophoretic suspension 190 is too conductive, the motion of solid charged structures 192 is very low. On the other hand, when electrophoretic suspension 190 is too resistive, the particles charge electronically resulting in a lack of suspension stability. In some examples, electrophoretic deposit 170 comprises at least one of ceramic, polymer, or glass.

Examples of Different Combinations of Electrolytic and Electrophoretic Deposits

Figure 4A:
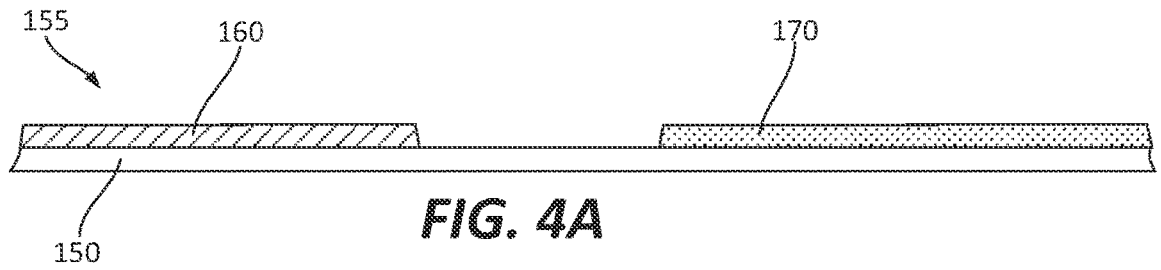
FIGS. 4A-4I are schematic cross-sectional views of different examples of a part comprising one or both electrolytic and electrophoretic depositions as well as other components.

FIGS. 4A-4G illustrates various combinations of electrolytic deposit 160 and electrophoretic deposit 170, forming part 155 on deposition electrode 150. As noted above, part 155 can be also referred to as a composite part due to the dissimilarities of materials of electrolytic deposit 160 and electrophoretic deposit 170, various examples of which are described above. Specifically, FIG. 4A illustrates an example where electrolytic deposit 160 and electrophoretic deposit 170 are formed at different portions of deposition electrode 150 such that these deposits do not overlap. For example, different sets of individually-addressable electrodes 142 can be used to form these deposits as further described below with reference to FIG. 5. In some examples, electrolytic deposit 160 and electrophoretic deposit 170 can be separated by a gap, e.g., another set of individually-addressable electrodes 142 remain deactivated during both electrolytic and electrophoretic deposition operations. Alternatively, electrolytic deposit 160 can contact each other electrophoretic deposit 170 without overlapping. It should be noted that once electrophoretic deposit 170 is formed on deposition electrode 150, the current may not pass through electrophoretic deposit 170 and further deposition (e.g., of electrolytic deposit 160) can be blocked. In other words, electrophoretic deposit 170 can be operable as a mask with electrolytic deposit 160. It should be also noted that this masking function can be achieved (while forming electrolytic deposit 160) without deactivating a set of individually-addressable electrodes 142 aligned with electrophoretic deposit 170 as further described below with reference to FIG. 7.

Alternatively, electrolytic deposit 160 and electrophoretic deposit 170 can fully or partially overlap. For purposes of this disclosure, the term "fully overlap" is defined as a structure with a top deposit (i.e., a later formed deposit) not extending beyond the boundary of the bottom deposit (i.e., an earlier form deposit). Alternatively, the term "partially overlap" is defined as a structure with a top deposit (i.e., a later formed deposit) extending beyond the boundary of the bottom deposit (i.e., to deposition electrode 150 or another deposit/earlier form deposit) such that both deposits interface with the same base (e.g., deposition electrode 150 or another deposit previously formed on deposition electrode 150). FIGS. 4B-4G illustrate various examples of overlapped/stacked deposits that can be both fully overlapping or partially overlapping.

Figure 4B:
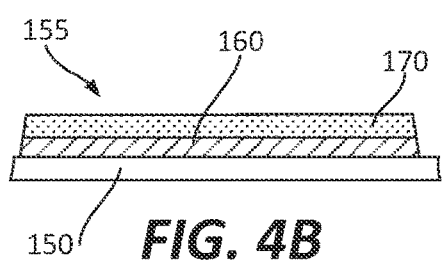
Figure 4D:
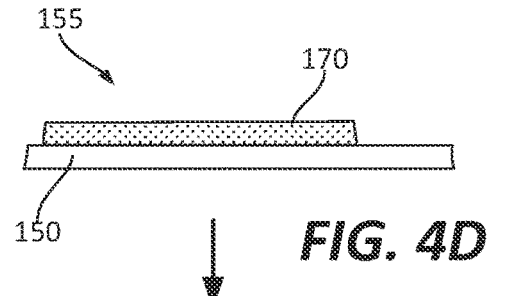

Specifically, FIG. 4B illustrates an example where electrophoretic deposit 170 is formed over electrolytic deposit 160 such that electrolytic deposit 160 is positioned between deposition electrode 150 and electrophoretic deposit 170. Because electrolytic deposit 160 can be formed from a conductive material (e.g., a metal layer), electrolytic deposit 160 can concentrate the electric field on its surface (facing electrophoretic suspension 190) thereby enabling the electrophoretic deposition over electrolytic deposit 160. In other words, electrophoretic deposit 170 can be formed directly over electrolytic deposit 160 and form a direct interface with electrolytic deposit 160, e.g., without a need for any intermediate layers, as shown in FIG. 4B.

Figure 4C:
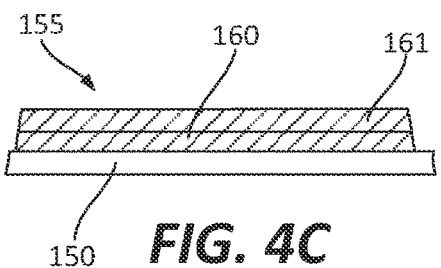

FIG. 4C illustrates an example where additional electrolytic deposit 161 is formed over electrolytic deposit 160 such that electrolytic deposit 160 is positioned between deposition electrode 150 and additional electrolytic deposit 161. As noted above, electrolytic deposit 160 can be formed from a conductive material (e.g., a metal layer). As such, electrolytic deposit 160 helps to conduct electrons when cations 183 are reduced on its surface thereby enabling the additional electrolytic deposit 161 to form over electrolytic deposit 160. In other words, additional electrolytic deposit 161 can be formed directly over electrolytic deposit 160 and form a direct interface with electrolytic deposit 160, e.g., without a need for any intermediate layers, as shown in FIG. 4C.

It should be noted that any number of electrolytic deposits can be stacked over each while manufacturing part 155. Each instance of an electrolytic deposit can be referred to as a print. Furthermore, it should be noted that these different electrolytic deposits can have the same or different compositions and/or other properties (e.g., porosity, density, grain structure). Finally, the top layer in a stack of electrolytic deposits can receive electrophoretic deposit 170, e.g., as described above with reference to FIG. 4B.

Figure 4E:
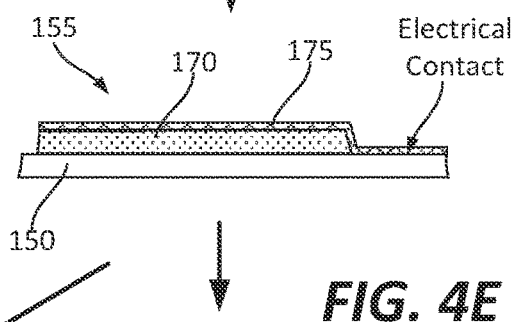
Figure 4H:
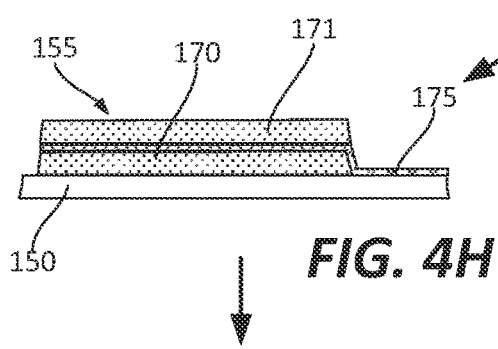
Figure 4F:
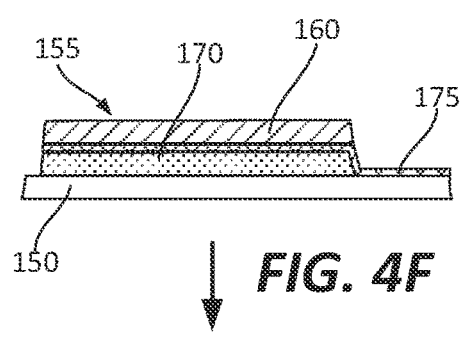
Figure 4I:
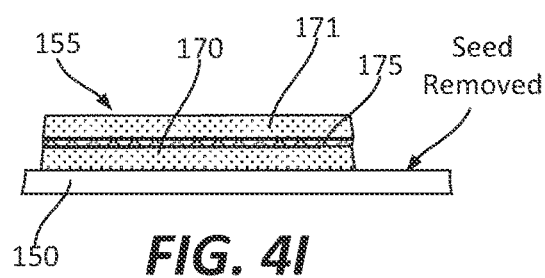
Figure 4G:
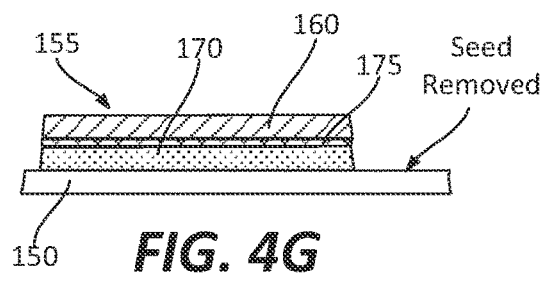
Figure 4H:
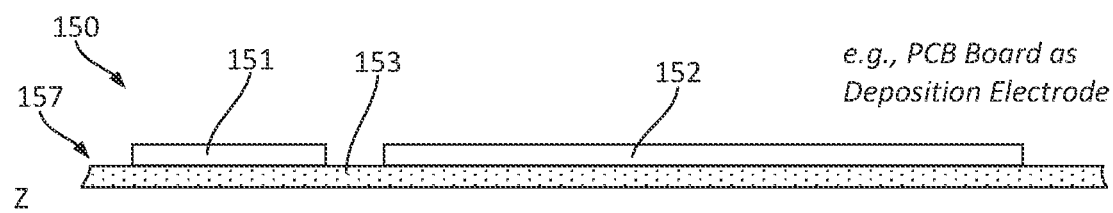
Figure 4I:
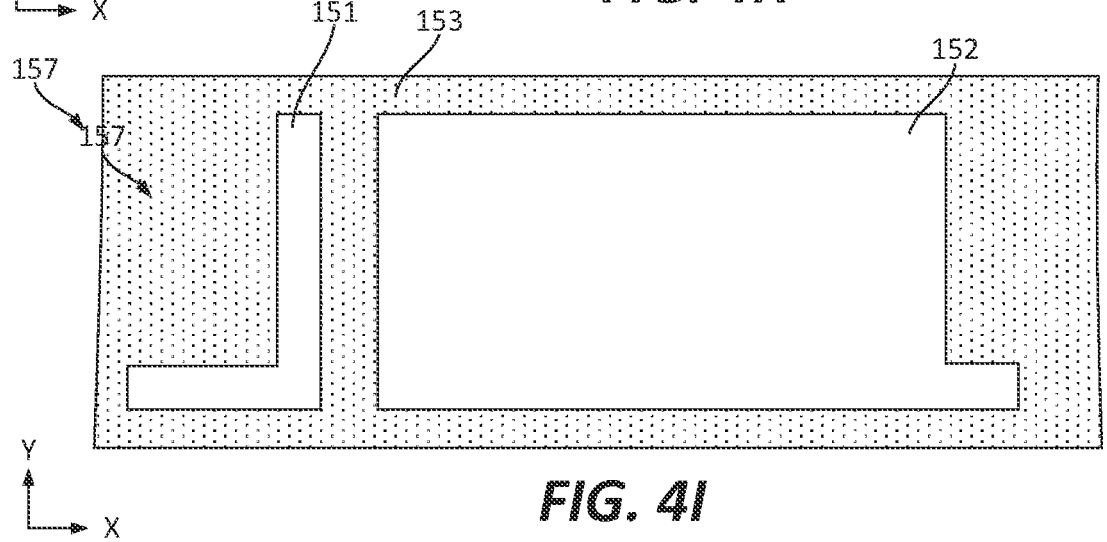

FIGS. 4D-4G illustrates different stages of forming a stack in which electrolytic deposit 160 is formed over electrophoretic deposit 170. Unlike electrolytic deposit 160, which can be conductive, electrophoretic deposit 170 is typically insulating. As such, once electrophoretic deposit 170 is formed over deposition electrode 150, electrophoretic deposit 170 blocks the electron conduction needed to form the electrolytic deposit 160. One way to overcome this limitation of electrophoretic deposit 170 is by forming conductive seed layer 175 over electrophoretic deposit 170. Conductive seed layer 175 is electrically coupled to deposition electrode 150, e.g., by extending beyond the footprint of electrophoretic deposit 170. In some examples, conductive seed layer 175 is directly interfacing with deposition electrode 150, e.g., as shown in FIG. 4E. Alternatively, conductive seed layer 175 is electrically coupled to deposition electrode 150 by other components of part 155, one or more electrolytic deposits. Conductive seed layer 175 can be formed using various techniques further described below. Once formed over electrophoretic deposit 170, conductive seed layer 175 provides electronic conductivity needed to form electrolytic deposit 160. In other words, electrolytic deposit 160 is formed over conductive seed layer 175 such that conductive seed layer 175 is positioned between electrolytic deposit 160 and electrophoretic deposit 170, e.g., as shown in FIG. 4F. If needed, a portion of conductive seed layer 175 extending from the stack formed by electrophoretic deposit 170, conductive seed layer 175, and electrolytic deposit 160 can be removed, e.g., as schematically shown in FIG. 4G. In general, in some examples, at least an additional portion of conductive seed layer 175 remains uncovered by electrolytic deposit 160.

In some examples, a later-formed electrolytic deposit 160 does not directly interface with an earlier-formed electrophoretic deposit 170, e.g., this interface is formed entirely by conductive seed layer 175. It should be noted that a stack in which electrolytic deposit 160 directly interfaces electrophoretic deposit 170 is possible but electrolytic deposit 160 needs to be formed first, and electrophoretic deposit 170 is formed over electrolytic deposit 160, e.g., as shown in FIG. 4B.

FIGS. 4D, 4E, 4H, and 4I illustrate different stages of forming a stack in which additional electrophoretic deposit 171 is formed over electrophoretic deposit 170. As noted above, electrophoretic deposit 170 is generally insulating. As such, once electrophoretic deposit 170 is formed over deposition electrode 150, electrophoretic deposit 170 may inhibit formation of an electric field such that additional electrophoretic deposit 171 cannot be formed directly over electrophoretic deposit 170. Conductive seed layer 175 can be formed over electrophoretic deposit 170 to address this issue. Conductive seed layer 175 is electrically coupled to deposition electrode 150, e.g., by extending over electrophoretic deposit 170. In some examples, conductive seed layer 175 is directly interfacing with deposition electrode 150. Alternatively, conductive seed layer 175 is electrically coupled to deposition electrode 150 by other components of part 155. Conductive seed layer 175 can be formed by using various techniques, such as electrolytic deposition.

Once formed over electrophoretic deposit 170, conductive seed layer 175 can support an electric field such that additional electrophoretic deposit 171 can be formed over conductive seed layer 175. In other words, additional electrophoretic deposit 171 is formed over conductive seed layer 175 such that conductive seed layer 175 is positioned between additional electrophoretic deposit 171 and electrophoretic deposit 170, e.g., as shown in FIG. 4H. As such, a later-formed additional electrophoretic deposit 171 does not directly interface with an earlier-formed electrophoretic deposit 170, e.g., this interface is formed entirely by conductive seed layer 175. If needed, a portion of conductive seed layer 175 extending from the stack formed by electrophoretic deposit 170, can be removed, e.g., as schematically shown in FIG. 4I. In general, any layers (e.g., unwanted electrophoretic deposit 171 formed due to deposition error or resolution issues) can be removed after the deposition steps.

FIGS. 4H-4Q illustrates additional examples of part 155, which is formed using additive manufacturing and comprising electrolytic and electrophoretic deposits. Specifically, FIGS. 4H and 4I are side and top schematic views of substrate 157 before forming any such deposits, in accordance with some examples. Substrate 157 is operable as deposition electrode 150 during additive manufacturing. In some examples, substrate 157 is a printed circuit board (PCB), where traces may be connected to the power supply and serve as deposition electrodes. Additive manufacturing may be used to form various circuit components (e.g., capacitors) on substrate 157. For example, a capacitor may require a large surface area between two electrodes where this area is filled with a dielectric material. A combination of this large area and small footprint can be achieved by forming an interdigitated-electrode structure, extending away from substrate 157. The two electrodes can be formed using electrolytic deposition, while the dielectric material can be formed using electrophoretic deposition. Referring to FIGS. 4H and 4I, substrate 157 can comprise dielectric base 153, first conductive portion 151, and second conductive portion 152. For example, substrate 157 can be a printed circuit board (PCB) or other like substrate. Dielectric base 153 provides support to each of first conductive portion 151 and second conductive portion 152. In the capacitor example, first conductive portion 151 and second conductive portion 152 are connected to or become parts of the two electrodes.

Figure 4J:
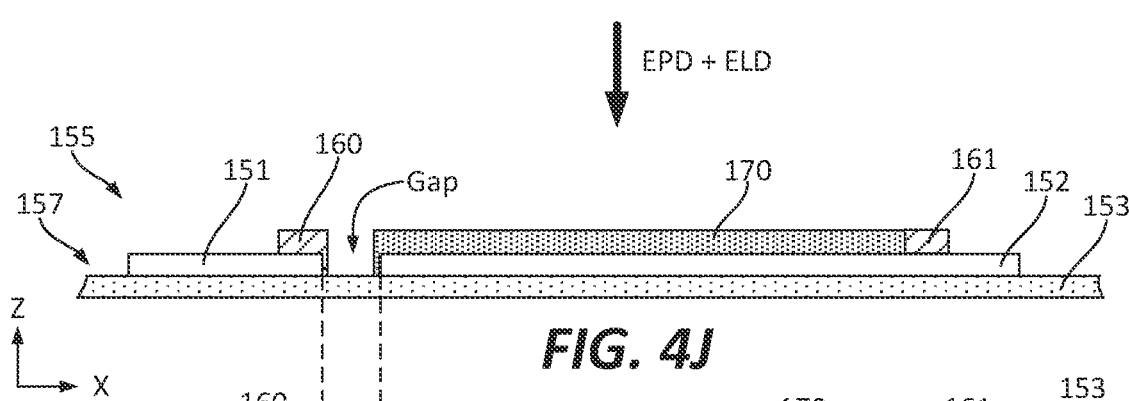
Figure 4K:
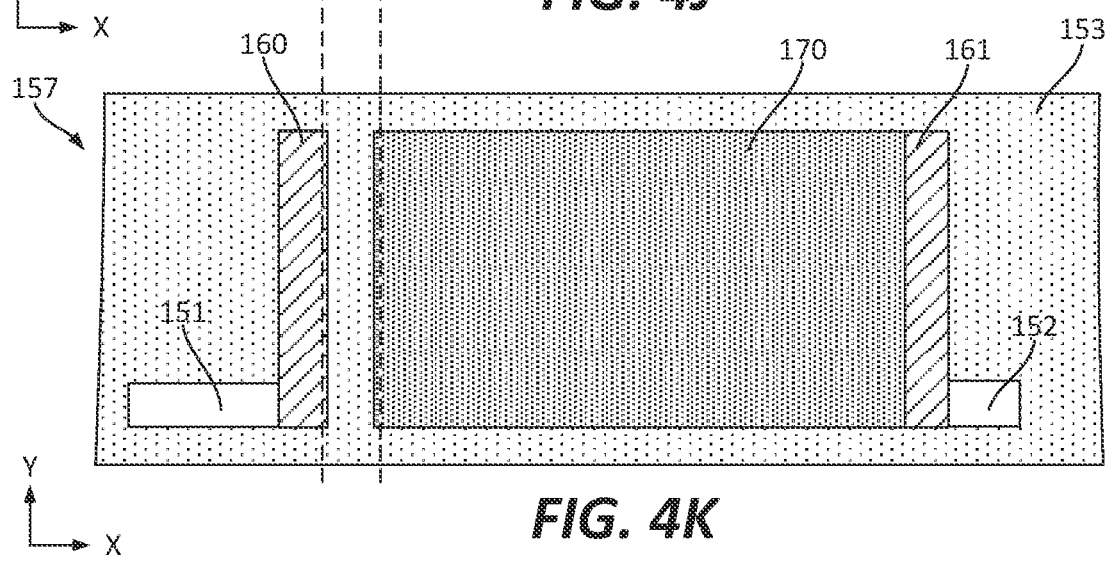

FIGS. 4J and 4K are side and top schematic views of substrate 157 after forming initial electrolytic and electrophoretic deposits. Specifically, electrolytic deposit 160 is formed on at least a part of first conductive portion 151. In some examples, another part of first conductive portion 151 can remain uncoated and can be used for forming other connections to this portion. Electrophoretic deposit 170 is formed on at least a part of second conductive portion 152. Furthermore, additional electrolytic deposit 161 can be formed on another part of second conductive portion 152. Yet another part of second conductive portion 152 can remain uncoated and can be used for forming other connections to this portion. In the capacitor example, first conductive portion 151 and electrolytic deposit 160 are operable as a first electrode, while second conductive portion 152 and additional electrolytic deposit 161 are operable as a second electrode.

FIG. 4L is a side schematic view of substrate 157 or, more accurately, of part 155 after forming second-layer electrolytic deposit 162. Specifically, second-layer electrolytic deposit 162 extends over electrolytic deposit 160 and a portion of electrophoretic deposit 170. However, second-layer electrolytic deposit 162 does not extend to additional electrolytic deposit 161 to ensure the insulation between the first and first electrodes. This electrolytic deposition operation can also form additional second-layer electrolytic deposit 163, positioned over additional electrolytic deposit 161 and separated from second-layer electrolytic deposit 162. Overall, first conductive portion 151, electrolytic deposit 160, and second-layer electrolytic deposit 162 are operable as a first electrode, while additional electrolytic deposit 161, and additional second-layer electrolytic deposit 163 are operable as a second electrode. This view how electrophoretic deposit 170 extends between second-layer electrolytic deposit 162 and second conductive portion 152 forming an interdigitated-electrode structure.

Referring to FIG. 4L or, more specifically, to the dotted line identified as "no interface" between electrolytic deposit 160 and second-layer electrolytic deposit 162, in some examples, electrolytic deposit 160 and second-layer electrolytic deposit 162 are monolithic without a defined grain boundary between electrolytic deposit 160 and second-layer electrolytic deposit 162. The monolithic "no interface" without a defined grain boundary is shown in a cross-sectional photo in FIG. 4M, which shows two electrolytic deposits forming a structure roughly corresponding to a stack of electrolytic deposit 160 and second-layer electrolytic deposit 162. The monolithic aspect of this electrolytically-deposited stack helps to reduce the risk of crack propagation and has various other benefits. It should be noted that these monolithic aspects are provided by various features of ECAM processes described above (e.g., precise control of current densities provided by the anode pixelation down to micrometers, potentially reversing the current flow for "cleaning" the deposition surface). For comparison, FIG. 4N illustrates a stack of two conductive layers, which is formed using a conventional electro-fill process and which shows a clear interface/grain boundary between these layers).

Figure 4P:
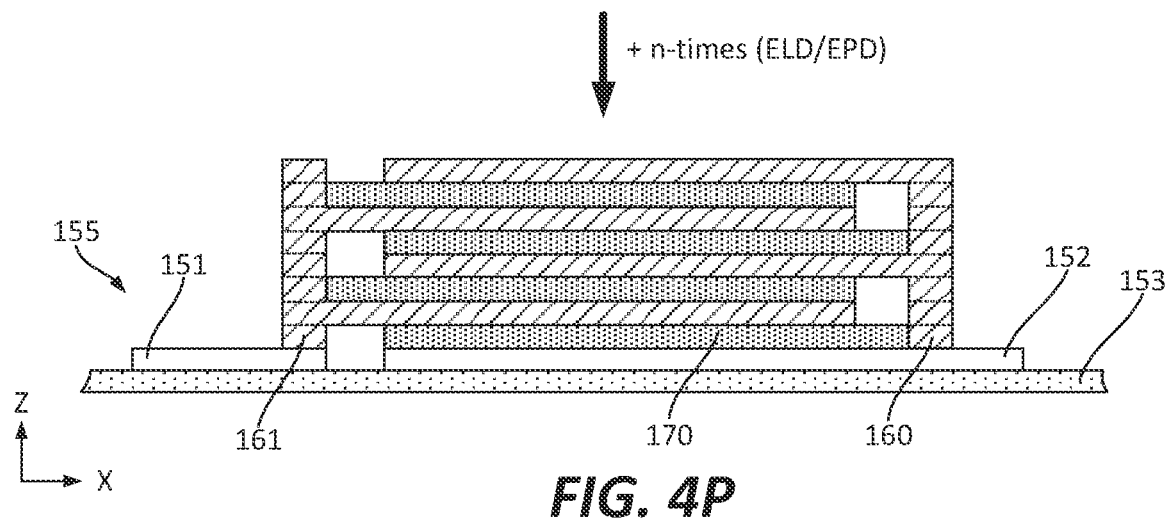
Figure 4Q:
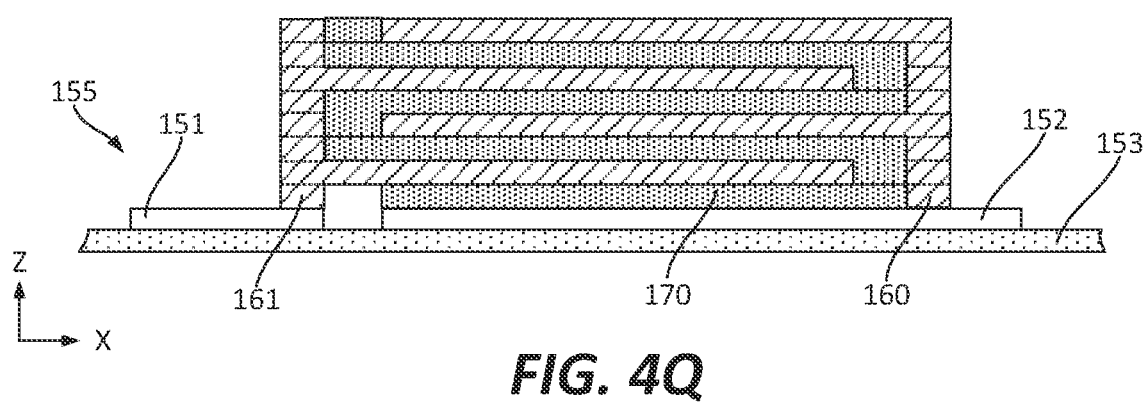

FIG. 4O is a side schematic view of part 155 after another set of electrolytic and electrophoretic depositions, showing additional interfaces being formed in the interdigitated-electrode structure. Furthermore, as shown in FIG. 4P, this process can continue to form any number of electrolytic and electrophoretic deposits. In this particular example, new electrophoretic deposits do not extend over previous electrophoretic deposits. As noted above, an electric field is needed to drive charged structures within the electrophoretic slurry to form a new electrophoretic deposit. A previous electrophoretic deposit can be sufficiently insulating and thick and interfere with forming the electric field and reducing this driving force. However, if a previous electrophoretic deposit is sufficiently thin while the potential (creating the electric field) is sufficiently high, new electrophoretic deposits can form over previous electrophoretic deposits, e.g., as schematically shown in FIG. 4Q. Both examples are within the scope.

Examples of Electrochemical-Additive Manufacturing Methods

Figure 5:
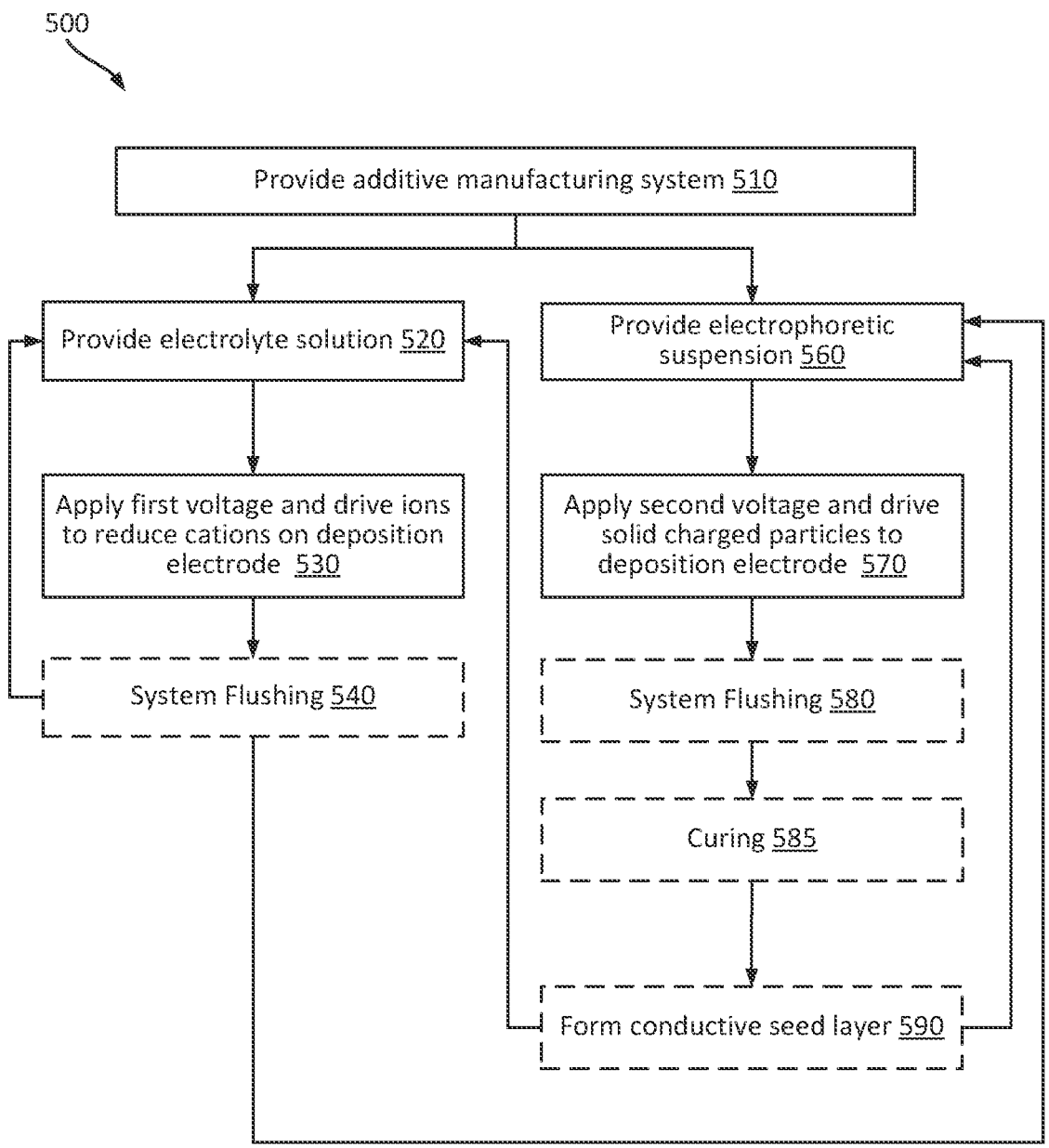
FIG. 5 is a process flowchart corresponding to a method of additive manufacturing of a part comprising an electrolytic deposit and an electrophoretic deposit, in accordance with some examples.

FIG. 5 is a process flowchart corresponding to method 500 for additive manufacturing of part 155 comprising electrolytic deposit 160 and electrophoretic deposit 170, in accordance with some examples. Various examples of part 155 or, more specifically, various orientations/positions of electrolytic deposit 160 and electrophoretic deposit 170 as well as other components are described above with reference to FIGS. 4A-4I.

In some examples, method 500 comprises (block 510) providing additive manufacturing system 100 comprising deposition control circuits 130, electrode array 140 comprising individually-addressable electrodes 142 each electrically coupled to one of deposition control circuits 130, and deposition electrode 150. Various examples of additive manufacturing system 100 are described above with reference to FIG. 1A-1C. It should be noted that additive manufacturing system 100 can be used for depositing both electrolytic deposit 160 and electrophoretic deposit 170, e.g., by (1) alternating processing fluids (e.g., electrolyte solution 180 and electrophoretic suspension 190) between electrode array 140 and deposition electrode 150 and (2) using different processing conditions (e.g., different voltages, activating different sets of individually-addressable electrodes 142). Such extensive levels of various process controls allow forming of different types of parts (e.g., material compositions, shapes, distribution of these materials within these shapes, and the like).

In some examples, method 500 comprises (block 520) providing electrolyte solution 180 between electrode array 140 and deposition electrode 150. If electrophoretic suspension 190 is present between electrode array 140 and deposition electrode 150, then this operation involves replacing electrophoretic suspension 190 with electrolyte solution 180 between electrode array 140 and deposition electrode 150.

Electrolyte solution 180 comprises at least cations 183, which are used to form electrolytic deposit 160 during later operations. Additional components of electrolyte solution 180 are described above with reference to FIG. 2B. Electrolyte solution 180 can be provided from electrolyte solution source 108, e.g., fluidically coupled to a processing cell formed by electrode array 140 and deposition electrode 150. For example, any previously used processing fluid can be flashed from the gap between electrode array 140 and deposition electrode 150 and fresh electrolyte solution 180 can be pumped into the gap during this electrolyte-solution-providing operation. Electrolyte solution 180 can be provided at a set temperature used for electrolytic deposition, which can be different from the temperature used for electrophoretic deposition. For example, electrolyte solution source 108 can be equipped with a heater to maintain electrolyte solution 180 at the set temperature.

When electrolyte solution 180 is provided between electrode array 140 and deposition electrode 150, method 500 proceeds with (block 530) applying a first voltage between first set 143 of individually-addressable electrodes 142 and deposition electrode 150. This first voltage is selected based on various parameters of additive manufacturing system 100, e.g., the electrochemical potential of various reactions occurring at electrode array 140 and deposition electrode 150, resistances of various components (e.g., the resistance of electrolyte solution 180 between electrode array 140 and deposition electrode 150), and the like.

The application of this first voltage drives cations 183 to deposition electrode 150 and causes cations 183 to reduce thereby forming electrolytic deposit 160 of part 155 on deposition electrode 150. As such, electrolytic deposit 160 is formed during this operation as schematically shown and described above with reference to FIG. 2A. This first-voltage application operation can be also referred to as an electrolytic deposition operation and each instance of this operation can be referred to as an electrolytic print. The first voltage as well as other process conditions (e.g., the electrolyte composition, electrode gap height, temperature) can be controlled to achieve various characteristics of electrolytic deposit 160.

In some examples, the electrolytic deposition operation/electrolytic print can be repeated multiple times, e.g., using the same composition of electrolyte solution 180 or different composition. It should be noted that during this electrolytic deposition operation, cations 183 are consumed from electrolyte solution 180, while products (e.g., gases) are released in electrolyte solution 180. As such, electrolyte solution 180 has to be periodically flushed and replaced with fresh electrolyte solution 180.

In some examples, method 500 comprises (block 540) system flushing such that electrolyte solution 180 is completely removed from additive manufacturing system 100. For example, this system flushing can be performed when replacing electrolyte solution 180 with electrophoretic suspension 190 or vice versa (e.g., as described below with reference to block 580). For example, flushing may be performed using a flushing liquid, which is compatible with both electrolyte solution 180 and electrophoretic suspension 190.

In some examples, method 500 comprises (block 560) providing electrophoretic suspension 190 between electrode array 140 and deposition electrode 150. If electrolyte solution 180 was previously present between electrode array 140 and deposition electrode 150, this operation may involve replacing electrolyte solution 180 with electrophoretic suspension 190 between electrode array 140 and deposition electrode 150. Electrophoretic suspension 190 comprises solid charged structures 192, which are used to form electrophoretic deposit 170 during later operations. Additional components of electrophoretic suspension 190 are described above with reference to FIGS. 3A and 3B.

Electrophoretic suspension 190 can be provided from electrophoretic suspension source 109, e.g., fluidically coupled to a processing cell formed by electrode array 140 and deposition electrode 150. For example, any previously used processing fluid can be flushed from the gap between electrode array 140 and deposition electrode 150 and fresh electrophoretic suspension 190 can be pumped into the gap during this electrophoretic-suspension-providing operation. Electrophoretic suspension 190 can be provided at a set temperature used for electrophoretic deposition, which can be different from the temperature used for electrolytic deposition. For example, electrophoretic suspension source 109 can be equipped with a heater to maintain electrophoretic suspension 190 at the set temperature.

When electrophoretic suspension 190 is provided between electrode array 140 and deposition electrode 150, method 500 proceeds with (block 570) applying a second voltage between second set 144 of individually-addressable electrodes 142 and deposition electrode 150. The second voltage may be different, e.g., greater, than the first voltage. This second voltage drives solid charged structures 192 to deposition electrode 150 and causes solid charged structures 192 to form electrophoretic deposit 170 of part 155 on deposition electrode 150. In other words, electrophoretic deposit 170 is formed during this operation as schematically shown and described above with reference to FIGS. 3A and 3B.

It should be noted that this second voltage may be limited based on the construction of electrode array 140, such as individually-addressable electrodes 142 and deposition control circuits 130. In some examples, the second voltage changes (e.g., increases) during this operation (e.g., as the thickness of electrophoretic deposit 170 increases). Furthermore, the second voltage may depend on the distance between deposition electrode 150 and electrode array 140 thereby collectively defining the value of applied fields (e.g., 20 V/0.2 cm). The duration of this operation may be self-limiting. For example, a micro-current through electrophoretic suspension 190 can be monitored to determine the end of this mask electrophoretic deposition operation.

In some examples, first set 143 of individually-addressable electrodes 142 (used for the electrolytic deposition) does not include any electrodes from second set 144 of individually-addressable electrodes 142 (used for the electrophoretic deposition). As such, electrolytic deposit 160 and electrophoretic deposit 170 are located at different portions of deposition electrode 150 and do not overlap, e.g., as shown in FIG. 4A and described above. It should be also noted that electrode array 140 and deposition electrode 150 can be also moved relative to each other between the electrolytic and electrophoretic deposition, e.g., translate or rotate in the directions substantially parallel to the surface of electrode array 140. This movement and the relative reference between electrode array 140 and deposition electrode 150 can also be used to determine the position of electrolytic deposit 160 and electrophoretic deposit 170 on part 155.

In some examples, (block 530) applying the first voltage is performed before (block 570) applying the second voltage. As such, electrolytic deposit 160 is formed before electrophoretic deposit 170. It should be also noted that electrolytic deposit 160 is typically conductive and can be used as a base for electrophoretic deposit 170 (e.g., similar to other conductive components of part 155 and/or deposition electrode). In these examples, electrophoretic deposit 170 can be formed over electrolytic deposit 160, such as fully or partially overlapping, e.g., as shown in FIG. 4B. More specifically, electrophoretic deposit 170 can be formed directly on and also interface electrolytic deposit 160. Alternatively, electrolytic deposit 160 and electrophoretic deposit 170 can be formed at different portions of deposition electrode 150 and do not overlap, e.g., as shown in FIG. 4A.

In some examples, (block 530) applying the first voltage is performed after (block 570) applying the second voltage. As such, electrolytic deposit 160 is formed after electrophoretic deposit 170. In these examples, electrolytic deposit 160 can be formed over electrophoretic deposit 170, such as fully or partially overlapping, e.g., as shown in FIGS. 4F and 4G, e.g., using conductive seed layer 175. It should be noted that electrophoretic deposit 170 can be non-conductive, in which case conductive seed layer 175 is used to conduct the current during the electrolytic deposition over electrophoretic deposit 170. Alternatively, electrolytic deposit 160 and electrophoretic deposit 170 can be formed at different portions of deposition electrode 150 and do not overlap, e.g., as shown in FIG. 4A. In these examples, other conductive structures of part 155 and/or deposition electrode 150 can be used to conduct the current during the electrolytic deposition.

In some examples, first set 143 of individually-addressable electrodes 142 includes at least some electrodes from second set 144 of individually-addressable electrodes 142. As such, electrolytic deposit 160 and electrophoretic deposit 170 at least partially overlap. More specifically, electrolytic deposit 160 and electrophoretic deposit 170 can fully overlap, e.g., as shown in FIGS. 4B and 4G. As noted above, electrophoretic deposit 170 can be positioned over electrolytic deposit 160 (e.g., FIG. 4B), or electrolytic deposit 160 can be positioned over electrophoretic deposit 170 (e.g., FIG. 4G). These overlapping examples are described above with reference to these figures.

As noted above, electrophoretic deposit 170 may be insulating and block the current flow to deposition electrode 150. In these examples, method 500 may comprise (block 590) forming conductive seed layer 175 over at least a portion of electrophoretic deposit 170 e.g., as schematically shown in FIG. 4E. Specifically, seed layer 175 may extend to a conductive portion of deposition electrode 150 (e.g., not covered by electrophoretic deposit 170). This conductive portion may be formed by the uncoated surface of deposition electrode 150, electrolytic deposit 160, or another instance of conductive seed layer 175. In general, any conductive portion that is electronically connected to deposition electrode 150 can interface with conductive seed layer 175. A portion of conductive seed layer 175 extends over electrophoretic deposit 170 thereby allowing the deposition of electrolytic deposit 160 over electrophoretic deposit 170 or, more specifically, to flow current to the electrolytic deposition sites positioned over electrophoretic deposit 170. This seed-layer forming operation is performed after forming electrophoretic deposit 170 (e.g., after (block 570) applying the second voltage) and before forming electrolytic deposit 160 (e.g., before (block 530) applying the first voltage).

Figure 6A:
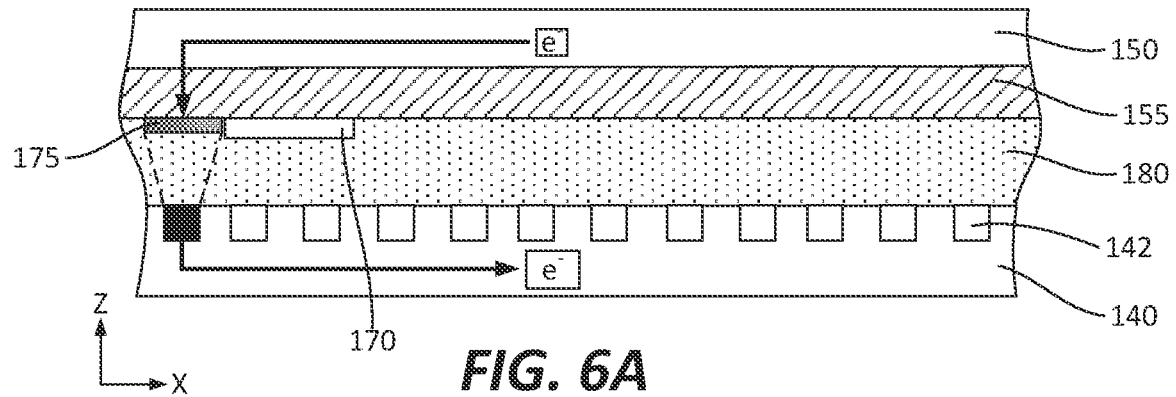
FIGS. 6A-6C are schematic cross-sectional views of different stages of electrolytically forming a conductive seed layer using an additive manufacturing system, the conductive seed layer is formed over an electrophoretic deposit using side-way electrolytic deposition, in accordance with some examples.
Figure 6B:
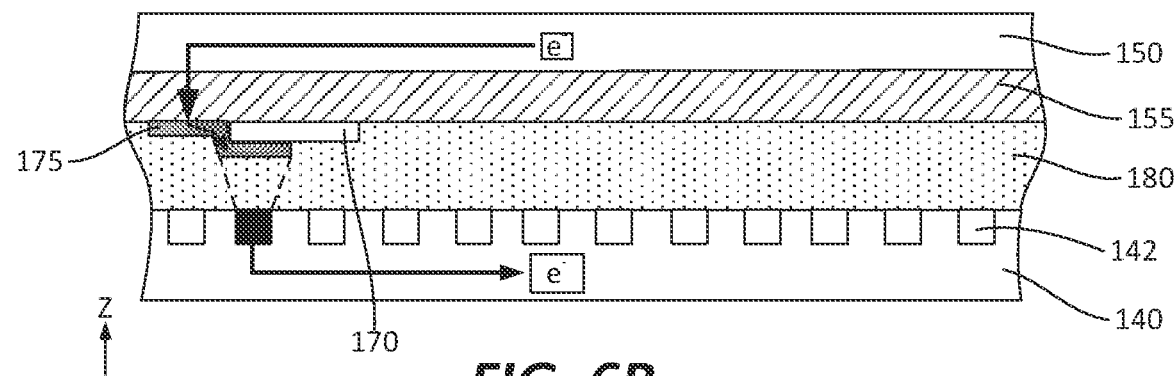
Figure 6C:
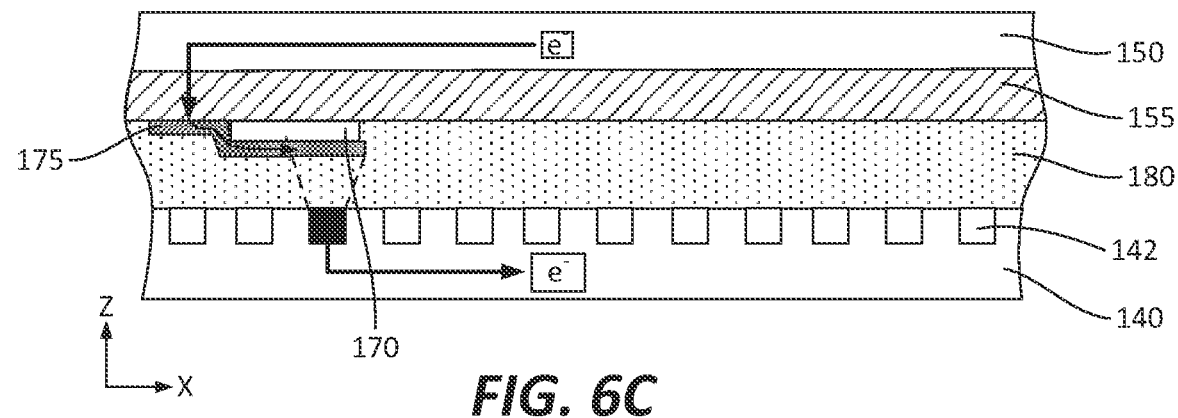

In some examples, conductive seed layer 175 is formed using side-way electrolytic deposition using a seed-layer electrolyte solution between electrode array 140 and deposition electrode 150, e.g., as schematically shown in FIGS. 6A-6C. Specifically, FIG. 6A illustrates a stage during which a portion of conductive seed layer 175 is formed away/on the side of electrophoretic deposit 170. In this example, deposition electrode 150 provides electronic conductivity during this deposition stage. Furthermore, the overlap between deposition electrode 150 and this portion of conductive seed layer 175 ensures electronic conductivity during other stages of the conductive seed layer deposition. FIG. 6B illustrates another stage during which another portion of conductive seed layer 175 is formed over electrophoretic deposit 170. This new portion of conductive seed layer 175 remains connected (monolithic) with the previously deposited portion (that interfaces deposition electrode 150). As such, this new portion remains electronically connected to deposition electrode 150 thereby allowing its deposition. FIG. 6C illustrates yet another stage during which yet another portion of conductive seed layer 175 is formed over electrophoretic deposit 170. This additional new portion of conductive seed layer 175 remains connected (monolithic) with the previously deposited portion (that interfaces deposition electrode 150). In other words, conductive seed layer 175 can be extended within a plane parallel to deposition electrode 150 and/or electrode array 140 by sequentially activating individually-addressable electrodes 142. In fact, these individually-addressable electrodes 142 can self-activate as conductive seed layer 175 extends and an electric current can be formed through new individually-addressable electrodes 142 aligned with this extended portion of conductive seed layer 175.

It should be noted that the formation of conductive seed layer 175 over electrophoretic deposit 170 can be an initial step in the formation of electrolytic deposit 160. In some examples, the same electrolyte solution 180 can be used to form conductive seed layer 175 and electrolytic deposit 160. As such, conductive seed layer 175 and electrolytic deposit 160 can have the same composition. More specifically, conductive seed layer 175 can be a part of electrolytic deposit 160.

In other examples, conductive seed layer 175 is formed using sputtering. For example, part 155 or, more generally, deposition electrode 150 with part 155 (partially formed over deposition electrode 150) can be removed from additive manufacturing system 100 and processed with a separate sputter system.

In some examples, additional electrophoretic deposit 171 is formed over previously-formed electrophoretic deposit 170, e.g., as schematically shown in FIGS. 4H and 4I. In this example, there is no electrolytic deposit 160 positioned between electrophoretic deposit 170 and additional electrophoretic deposit 171. It should be noted that since previously-formed electrophoretic deposit 170 can be non-conductive, conductive seed layer 175 can be first formed over previously-formed electrophoretic deposit 170. Specifically, method 500 further comprises (block 590) forming conductive seed layer 175 over at least a portion of electrophoretic deposit 170 (e.g., as shown in FIG. 4E). Method 500 then proceeds with depositing additional solid charged structures as additional electrophoretic deposit 171 over conductive seed layer 175, extending over electrophoretic deposit 170 on deposition electrode 150.

In some examples, method 500 further comprises depositing additional electrolytic deposit 161 over electrolytic deposit 160 of part 155 on deposition electrode 150. In these examples, the earlier deposited electrolytic deposit 160 provides electronic conductivity during the formation of additional electrolytic deposit 161.

Figure 7:
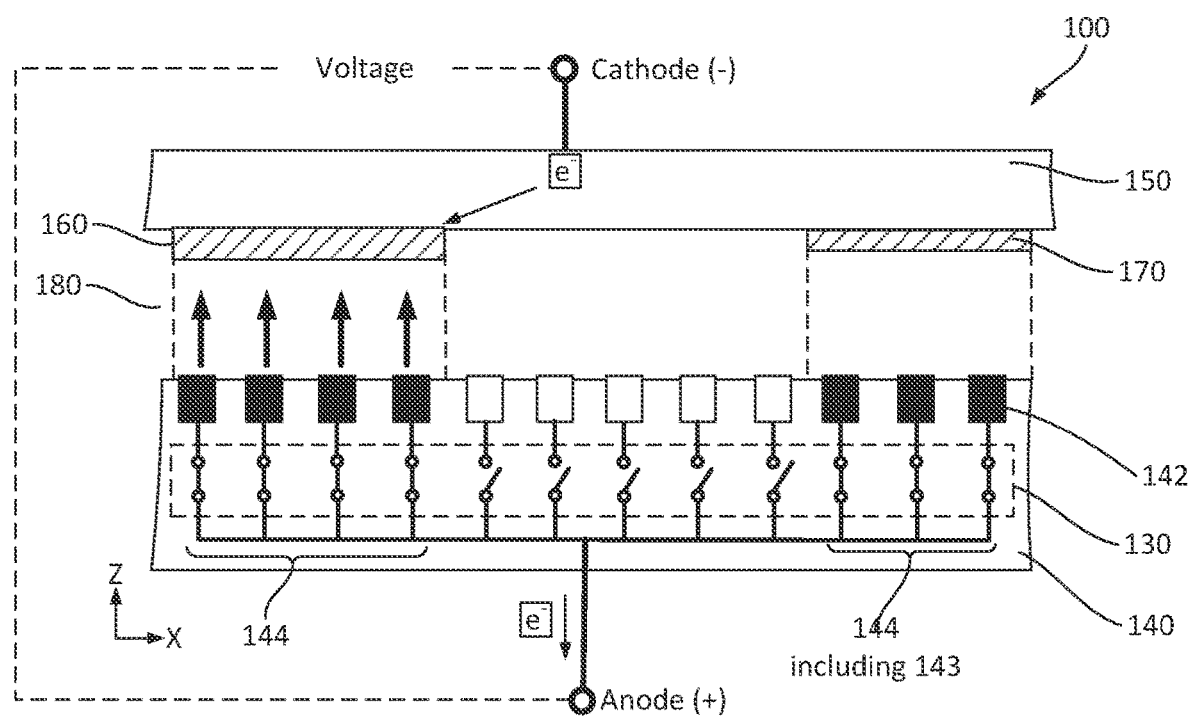
FIG. 7 is a schematic cross-sectional view of an additive manufacturing system during the electrolytic deposition, in which a previously-formed electrophoretic deposit masks/blocks a portion of the deposition electrode, in accordance with some examples.

In some examples, electrophoretic deposit 170 is deposited before electrolytic deposit 160 and is used to block the current to the portion of deposition electrode 150 that is covered with electrophoretic deposit 170, e.g., as schematically shown in FIG. 7. In other words, even though individually-addressable electrodes 142 facing this electrophoretic deposit 170 are activated while forming the electrolytic deposit 160, there is no corresponding electrolytic deposit formed over electrophoretic deposit 170. In other words, electrophoretic deposit 170 effectively masks a portion of part 155 reducing the level of control needed at individually-addressable electrodes 142. In these examples, first set 143 of individually-addressable electrodes 142 also includes at least some electrodes from second set 144 of individually-addressable electrodes 142. Second set 144 is aligned with electrophoretic deposit 170 (i.e., depositing solid charged structures 192 as electrophoretic deposit 170 is performed before reducing cations 183 into electrolytic deposit 160). In this example, electrophoretic deposit 170 prevents the deposition of electrolytic deposit 160 over electrophoretic deposit 170. As such, electrolytic deposit 160 and electrophoretic deposit 170 do not overlap.

Referring to FIG. 5, in some examples, method 500 further comprises (block 540) flushing electrolyte solution 180 between electrode array 140 and deposition electrode 150. This operation is performed after (block 530) applying the first voltage and, e.g., before (block 560) providing electrophoretic suspension 190 between electrode array 140 and deposition electrode 150.

In some examples, method 500 further comprises (block 580) flushing electrophoretic suspension 190 between electrode array 140 and deposition electrode 150. This operation is performed after (block 570) the second voltage and, e.g., before (520) introducing electrolyte solution 180 between electrode array 140 and deposition electrode 150.

In some examples, method 500 further comprises (block 585) curing electrophoretic deposit 170. This operation is performed, e.g., after (block 580) flushing electrophoretic suspension 190 or, more specifically, after removing deposition electrode 150 from electrophoretic suspension 190.

Experimental Results

An experiment was conducted to form an electrophoretic deposit on a printed circuit board (PCB) plated with electroless nickel gold (ENiG) connected to a deposition electrode. The PCB was first cleaned in a degreaser followed by rinsing in DI water, 1% H2SO4 acid-dip, another rinsing in deionized water (DI) water, and air drying. The PCB was then immersed into an EPD suspension comprising ceramic charged particles (KLIAR-BLU1 from Legor Group in Italy) and agitated back and forth for a few seconds. A programmable power supply (from Korad Technologies in China) was connected to the PCB and electrode array (which was also submerged into the EPD suspension). The electrode array was then powered up and a test image was commanded to display on the electrode array via a system controller. The voltage on the power supply was set to +30V output from the electrode array with respect to the PCB. A 70-micrometer thick shim was inserted around the perimeter, between the PCB and electrode array, to provide a consistent thin gap for EPD deposition. The power supply was pulsed on and off 20 times for 0.5 sec at the 30V potential. The PCB was then disconnected from the deposition electrode and the EPD solution was rinsed with DI water followed by air dry and curing the electrophoretically-deposit mask formed on the ENIG plated portion of the PCB.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present embodiments are to be considered illustrative and not restrictive.

The invention claimed is:

1. A method for additive manufacturing of a part comprising an electrolytic deposit and an electrophoretic deposit, the method comprising:
providing an additive manufacturing system comprising deposition control circuits, an electrode array comprising individually-addressable electrodes each electrically coupled to one of the deposition control circuits, and a deposition electrode;
providing an electrolyte solution between the electrode array and the deposition electrode, wherein the electrolyte solution comprises cations;
applying a first voltage between a first set of the individually-addressable electrodes and the deposition electrode thereby driving the cations to the deposition electrode and reducing the cations into the electrolytic deposit of the part on the deposition electrode;
replacing the electrolyte solution with an electrophoretic suspension between the electrode array and the deposition electrode, wherein the electrophoretic suspension comprises solid charged structures; and
applying a second voltage between a second set of the individually-addressable electrodes and the deposition electrode thereby driving the solid charged structures to the deposition electrode and depositing the solid charged structures as the electrophoretic deposit of the part on the deposition electrode.

2. The method of claim 1, wherein:
the electrolytic deposit and the electrophoretic deposit are located at different portions of the deposition electrode and do not overlap, and
the first set of the individually-addressable electrodes does not include any electrodes from the second set of the individually-addressable electrodes.

3. The method of claim 2, wherein:
the electrolytic deposit is formed before forming the electrophoretic deposit, and
applying the first voltage is performed before applying the second voltage.

4. The method of claim 2, wherein:
the electrolytic deposit is formed after forming the electrophoretic deposit, and
applying the first voltage is performed after applying the second voltage.

5. The method of claim 1, wherein:
the electrolytic deposit and the electrophoretic deposit at least partially overlap, and
the first set of the individually-addressable electrodes includes at least some electrodes from the second set of the individually-addressable electrodes.

6. The method of claim 5, wherein:
at least a portion of the electrolytic deposit is positioned between the electrophoretic deposit and the deposition electrode, and
applying the first voltage is performed before applying the second voltage.

7. The method of claim 5, wherein at least a portion of the electrophoretic deposit extends past the electrolytic deposit such that the electrolytic deposit does not extend between this portion of the electrophoretic deposit and the deposition electrode.

8. The method of claim 5, wherein:
at least a portion of the electrophoretic deposit is positioned between the electrolytic deposit and the deposition electrode, and
applying the first voltage is performed after applying the second voltage.

9. The method of claim 8, further comprising, after applying the second voltage and before applying the first voltage, forming a conductive seed layer over at least the portion of the electrophoretic deposit, wherein the electrolytic deposit covers at least a portion of the conductive seed layer.

10. The method of claim 9, wherein the conductive seed layer is formed using side-way electrolytic deposition using a seed-layer electrolyte solution between the electrode array and the deposition electrode.

11. The method of claim 9, wherein the conductive seed layer is formed using sputtering.

12. The method of claim 9, wherein at least an additional portion of the conductive seed layer remains uncovered by the electrolytic deposit.

13. The method of claim 9, wherein the conductive seed layer is a part of the electrolytic deposit.

14. The method of claim 1, further comprising, after applying the second voltage:
   forming a conductive seed layer over at least a portion of the electrophoretic deposit; and
   depositing additional solid charged structures as an electrophoretic deposit of the part on the deposition electrode.

15. The method of claim 1, further comprising depositing additional electrolytic deposit over the electrolytic deposit of the part on the deposition electrode.

16. The method of claim 1, wherein:
   the first set of the individually-addressable electrodes includes at least some electrodes from the second set of the individually-addressable electrodes,
   depositing the solid charged structures as the electrophoretic deposit is performed before reducing the cations into the electrolytic deposit, and
   the electrolytic deposit and the electrophoretic deposit do not overlap.

17. The method of claim 1, wherein:
   the electrolytic deposit comprises at least one of copper, nickel, tungsten, gold, silver, cobalt, chrome, iron, or tin; and
   the electrophoretic deposit comprises at least one of ceramic, polymer, or glass.

18. The method of claim 1, further comprising:
   after applying the first voltage, flushing the electrolyte solution between the electrode array and the deposition electrode, and
   after applying the second voltage, flushing the electrophoretic suspension between the electrode array and the deposition array.

\* \* \* \* \*